US007661042B2

(12) United States Patent
Matsuoka et al.

(10) Patent No.: US 7,661,042 B2
(45) Date of Patent: Feb. 9, 2010

(54) LOW-POWER CONTENT-ADDRESSABLE-MEMORY DEVICE

(75) Inventors: Hideto Matsuoka, Tokyo (JP);
Kazunari Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/265,869

(22) Filed: Nov. 6, 2008

(65) Prior Publication Data
US 2009/0067209 A1    Mar. 12, 2009

Related U.S. Application Data

(62) Division of application No. 11/389,359, filed on Mar. 27, 2006, now Pat. No. 7,469,369.

(30) Foreign Application Priority Data

Mar. 31, 2005 (JP) ............................ 2005-102932
Jan. 12, 2006 (JP) ............................ 2006-005134

(51) Int. Cl.
*G11C 29/00*    (2006.01)
*G11C 15/00*    (2006.01)
(52) U.S. Cl. .................................. 714/718; 365/49.18
(58) Field of Classification Search .................. 714/718; 365/49.18
See application file for complete search history.

(56) References Cited

U.S. PATENT DOCUMENTS 6,000,008 A    12/1999 Simcoe

| 6,324,087 | B1 | 11/2001 | Pereira |
| 6,470,418 | B1 | 10/2002 | Lien et al. |
| 6,700,810 | B1 * | 3/2004 | Ichiriu et al. ............. 365/49.18 |
| 6,707,692 | B2 | 3/2004 | Hata et al. |
| 6,751,755 | B1 | 6/2004 | Sywyk et al. |
| 6,807,077 | B2 | 10/2004 | Noda et al. |
| 6,987,683 | B2 | 1/2006 | Ao |
| 7,116,569 | B2 | 10/2006 | Hinojosa et al. |

FOREIGN PATENT DOCUMENTS

JP    5-190788    7/1993

(Continued)

OTHER PUBLICATIONS

Kenneth J. Schultz et al. "Fully Parallel Integrated CAM/RAM Using Preclassification to Enable Large Capacities"; IEEE Journal on Solid-State Circuits; vol. 31; No. 5; May 1996; pp. 689-699.

(Continued)

*Primary Examiner*—James C Kerveros
(74) *Attorney, Agent, or Firm*—Oblon, Spivak, McClelland, Maier & Neustadt, L.L.P.

(57) ABSTRACT

A plurality of content-addressable-memory sub-arrays simultaneously performs a parallel comparison between data sequences arranged in a row direction of memory cells and a search data sequence input from outside, and outputs a result of the comparison for each data sequence. A first input pin receives an input of the search data sequence. A second input pin receives an input of a search data sequence arbitrarily designating a content-addressable-memory sub-array. Each of the content-addressable-memory sub-arrays includes an activation control unit that controls activation of the content-addressable-memory sub-arrays based on the search data sequence.

2 Claims, 29 Drawing Sheets

FOREIGN PATENT DOCUMENTS

| | | |
|---|---|---|
| JP | 6-131897 | 5/1994 |
| JP | 6-333395 | 12/1994 |
| JP | 8-147999 | 6/1996 |
| JP | 9-180498 | 7/1997 |
| JP | 2002-260389 | 9/2002 |
| JP | 2003-303495 | 10/2003 |

OTHER PUBLICATIONS

Hideyuki Noda, et al. "A Cost-Efficient High-Performance Dynamic TCAM With Pipelined Hierarchical Searching and Shift Redundancy Architecture", IEEE Journal of Solid-State Circuits, vol. 40, No. 1, Jan. 2005, pp. 244-253.

* cited by examiner

FIG.28

|  | STORED VALUE "0"<br>Cell_0=L,Cell_1=H | STORED VALUE "1"<br>Cell_0=H,Cell_1=L | STORED VALUE "X"<br>Cell_0=H,Cell_1=H |
|---|---|---|---|
| SEARCH<br>VALUE "0"<br>SL=L,/SL=H | MATCH<br>(ML=H) | MISMATCH<br>(ML=L) | MATCH<br>(ML=H) |
| SEARCH<br>VALUE "1"<br>SL=H,/SL=L | MISMATCH<br>(ML=L) | MATCH<br>(ML=H) | MATCH<br>(ML=H) |

LOW-POWER CONTENT-ADDRESSABLE-MEMORY DEVICE

This application is a division of U.S. application Ser. No. 11/389,359, filed Mar. 27, 2006, now U.S. Pat. No. 7,469,369, issued Dec. 23, 2008, which claims the benefit of Japanese Application Number 2005-102932 filed Mar. 31, 2005 and Japanese Application Number 2006-005134 filed Jan. 12, 2006.

BACKGROUND OF THE INVENTION

1. Field of the Invention

The present invention relates to a content-addressable-memory (CAM) device that stores three values of "1", "0", and "X (undefined)" and to be used for searching data and a remedial method for the CAM.

2. Description of the Related Art

A CAM that stores three values of "1", "0", and "X" is referred to as a ternary content addressable memory (TCAM). The TCAM is one of memory large scale integrations (LSIs) that are frequency used in applications of address path search like a router and a switch of network apparatuses in recent years. A conventional CAM is schematically explained below with reference FIGS. 24 to 28. FIG. 24 is a block diagram of an example of a constitution of a network apparatus. FIG. 25 is a diagram of a packet constitution in an Ethernet (registered trademark) frame. FIG. 26 is a block diagram for explaining a main part constitution of a CAM shown in FIG. 24. FIG. 27 is a circuit diagram showing a constitution of a CAM array shown in FIG. 26. FIG. 28 is a truth table for explaining a relation between a stored value and a search value of a TCAM unit cell shown in FIG. 27.

In the network apparatus shown in FIG. 24, a CAM 100, a control unit (Central Processing Unit (CPU)) 200, an action memory (Static Random Access Memory (SRAM)) 300, a packet buffer (Dynamic Random Access Memory (DRAM)) 400, an interface unit (Ingress, Egress) 500 of the Ethernet are connected via a switching circuit 600. The CAM 100 serves as a searching unit and includes a MAC table 100a, an IP table 100b, and a filtering table 100c.

As shown in FIG. 24, a packet in the Ethernet frame is generally standardized and includes a "Pre-amble" field, an "SFD" field, a "Destination" field, a "Source" field, a "Type/Length" field, a "Transmitting Message" field, a "PAD" field, and an "FCS" field.

In FIG. 24, a packet on the network is captured from the Ingress of the interface unit 500. A header section (Destination and Source) in the packet captured is sent to the CAM 100 for search. A content section (Transmitting Message) in the packet is sent to the packet buffer (DRAM) 400 to be held therein until search ends.

Usually, a plurality of number of times of search processing is required for one packet. For example, search of a transmission destination and a transmission source of an MAC using the MAC table 100a (L2 search), search of a transmission destination and a transmission source of an IP using the IP table 100b (L3 search), and filtering of a TCP and a UDP using the filtering table 100c (filtering of L4) are performed. Thus, search is performed five times per one packet. If a data sequence matching the IP transmission destination searched is found in the CAM 100, the CAM 100 outputs an address of the IP transmission destination matching the data sequence. Then, the CAM 100 reads out a rule that should actually be taken from the action memory 300 with the address as an index address.

In this way, the CAM 100 has a function of judging at high speed whether there is an address matching a data sequence requested to be searched in a search operation and outputting an address matching the data sequence to the outside. As the action memory 300, usually, an SRAM is used. As a representative action, other than designation of the next hop address for the transmission destination, filtering for discarding an unnecessary packet, Quality of Service (QoS) for prioritizing packet processing, and the like. If an action is determined, the CAM 100 rewrites the header section, reproduces the packet by attaching contents stored in the packet buffer 400 to the packet, and transmits the packet from the Egress of the interface unit 500 to the Internet environment.

A constitution and operations of the CAM 100 shown in FIG. 24 are schematically explained with reference to FIGS. 26 to 28. In FIG. 26, the MAC table 100a, the IP table 100b, and the filtering table 100c constituting the CAM 100 shown in FIG. 24 basically include a CAM array 110, a row decoder 106, a sense amplifier 105, a search-line driving circuit 102, a match amplifier 103, and a priority encoder 104, which are arranged in the outer periphery of the CAM array 110, respectively. The row decoder 106, the sense amplifier 105, and the search-line driving circuit 102 are connected to an input pin 101 serving as an input node. The match amplifier 103 is also referred to as "sense amplifier" like the sense amplifier 105. However, to clarify a function thereof, the match amplifier 103 is referred to as "match amplifier".

The input pin 101 is used for data input and output for writing data in and reading data out from the CAM and used as an address input pin other than the application for search data input. In the writing in the CAM, when writing data is given from the input pin 101, the data is transferred to a bit line (BL) via the sense amplifier 105. When a writing address is given from the input pin 101, the row decoder 106 drives a corresponding word line (WL) to complete the writing. When the writing in all rows of the CAM array 110, almost all operations after that are search operations.

Actually, in the CAM used in the network apparatus, the search operations occupy about 90% of operations rather than writing and readout. In the search operation, when a data sequence to be searched is given to the same input pin 101 as a search request, the search-line driving circuit 102 drives a search line SL. A result of judgment on whether the data sequence to be searched and data sequence in the CAM array 110 coincide with each other appears on a common match line SL by a unit of data sequence. The match amplifier 103 amplifies a response of the match line SL at high speed. The response is transmitted to the priority encoder 104. A final matching address is output to the outside from a search-result output pin 107, which is an output node, to the outside.

As shown in FIG. 27, the CAM array 110 is constituted by arranging a TCAM unit cell 111, which holds three values of "1", "0", and "X", in row and column directions. The TCAM unit cell 111 holds the three values of "1", "0", and "X" in the SRAM using two bits. A bit line BL and a word lie WL are used for writing and readout. This operation is basically the same as the operation of the SRAM.

In the search operation, the search line SL is driven on the basis of search object data as described above. A result of matching comparison appears on a match line ML. The match line ML is commonly used with the data sequence of the CAM controlled by the word line WL. The match line ML is pre-charged to a high level before starting the search operation. Only the match line ML of data sequence matching (HIT) in comparison of all bits maintains the high level (FIG.

28: ML=H). Conversely, when at least one bit mismatches (MISS), the match line ML discharges to be at a low level (FIG. 28: ML=L).

Usually, since the third value "X" is not used in the case of the L2 search, the matching data sequence is an only address and the match lines ML of the other all addresses are discharged. On the contrary, in the case of an application using the third value "X", a plurality of addresses are often hit (matches) simultaneously (see FIG. 28). In this case, the priority encoder 104 treats an address with a smallest value preferentially and encodes and outputs the address.

Therefore, usually, a more specific data sequence not having the "X" value is maintained in an application to be sorted to an order with a smaller address number (Longest Prefix Match). In the priority encoder 104, respective cells communicate with one another in up and down directions. When a large number of matches (hits) occur, first, the priority encoder 104 judges whether there is a hit above or below an own cell and, thereafter, finally outputs an encode address.

Such a CAM executes searches simultaneously and in parallel compared with the conventional search according to the tree method and the hash method. Thus, it is possible to perform processing at high speed and in a fixed time. However, since the simultaneous parallel searches use an entire memory area as an operation area, this means that the entire memory area is activated simultaneously. Power consumption at the time of the search operation imposes a significant problem in a large capacity CAM with 18M bits at the present. Specifically, whereas power consumption of the usual SRAM is about 1 watt to 2 watts, power consumption at the time when, for example, the 18M bit TCAM performs a search operation in the order of 100 megahertz is equal to or larger than 10 watts. Basically, power consumption is proportional to an activation area at the time of the operation. It is important for low power consumption to find how the operation area should be reduced without sacrificing the high-speed search performance. From such a viewpoint, various studies have been performed (e.g., K. J. Schults, and P. G. Gulak, "Fully Parallel Integrated CAM/RAM Using Pre-classification to Enable Large Capacities" IEEE Journal of Solid-State Circuits, vol. 31, No. 5, pp. 689-699 (May 1996 and H. Noda, K. Inoue, M. Kuroiwa, F. Igaue, K. Yamamoto, A. Hachisuka, H. J. Mattausch, T. Koide, A. Amo, S. Soeda, I. Hayashi, F. Morishita, K. Dosaka, K. Arimoto, K. Fujishima, K. Anami, and T. Yoshihara, "A cost-Efficient High-Performance Dynamic TCAM with Pipeline Hierarchical Searching and Shift Redundancy Architecture," IEEE Journal of Solid-State Circuits, vol. 40, No. 1 pp. 245-253, January 2005).

As it is understood from the above explanation, there are two causes for the problem of power consumption involved in the search operation by the CAM. First, a data sequence to be searched is converted into processing of activation of the search line SL. As described above, all the search lines SL on the CAM array are activated simultaneously and in parallel to one another. Second, all the match line ML of the data sequence mismatching because of the activation of the search lines SL are discharged. As described above, almost all the match lines ML repeat charging and discharging. Actually, if the search lines SL and the match lines ML are removed, a structural operation is the same as that of the SRAM, and power consumption is not at a problematic level.

A plurality of times of search operations are required for one packet. On the other hand, when a capacity of the CAM was as small as 1M bit, different CAMLSIs were prepared for respective applications such as for L2 and L3 and search was executed in a minimum activation area first for L2 and then for L3. Thus, power consumption was not a significant problem.

Thus, a method of realizing low power consumption following the example described above even in a large capacity CAM with 18M bits in these days is proposed in, for example, U.S. Pat. No. 6,324,087 (FIG. 29) and U.S. Pat. No. 6,470,418 (FIG. 30). FIGS. 29 and 30 are block diagrams of conventional examples for realizing low power consumption of a large capacity CAM.

In FIG. 29, reference signs 110a to 110d denote CAM sub-arrays. Reference signs 102a to 102d denote search-line driving circuits, which are connected in parallel to a bus on which a data sequence requested to be searched is arranged. Reference signs 103a to 103d denote match amplifiers. Outputs of the match amplifiers 103a to 103d are sent to an output bus in parallel. The priority encoder 104 extracts and outputs the outputs to the outside. An address translation logic 120 that can designate four sub-arrays individually is provided.

In this constitution, the address translation logic 120 issues bank address signals BS_0, BS_1, BS_2, and BS_3. This allows the four sub-arrays to perform a dividing operation. For example, the BS_0 sub-array is defined as a sub-array for L2 and the BS_1 sub-array is defined as a sub-array for IP and the bank address signals BS_0, BS_1, BS_2, and BS_3 are issued from the address translation logic 120, respectively, at the time of the search operation. This makes it possible to prevent all the sub-arrays from being activated simultaneously and realize low power consumption.

In FIG. 30, a CAM array is divided into two and the respective divided arrays include four sub-arrays as shown in FIG. 29. In the figure, a search request (1/2) is input to a first divided array on the left and a search request (2/2) is input to a second divided array on the right. Outputs of match amplifiers 103a_1, 103b_1, 103c_1, and 103d_1 in the first divided array on the left are given to corresponding match lines of CAM sub-arrays 110a_2, 110b_2, 110c_2, and 110d_2 in the second divided array on the right. Outputs of match amplifiers 103a_2, 103b_2, 103c_2, and 103d_2 in the second divided array are sent to an output bus in parallel. The priority encoder 104 extracts and outputs the outputs to the outside. In this constitution, first, search is performed in the first divided CAM array and only a match line ML of the second divided array connected to a sub-array having a matching match line ML operates. Thus, it is possible to realize low power consumption.

The CAM also has a problem of manufacturing cost in addition to the problem of power consumption. A technology generation for memory LSIs changes in about every four years. Only a capacity of the memory LSIs is expanded to twice to four times as large as that in the previous generations while keeping substantially a fixed price. A bit unit price is reduced to a half or a quarter every time the generation changes. However, this trend rule is not applied to the CAM at all, although the CAM is one of memory LSIs. For example, a market price of a 4.5M bit TCAM is about 50 dollars and a market price of a 18M bit TCAM having a capacity four times as large as that of the 4.5M bit TCAM is equal to or higher than 200 dollars. There are various factors affecting market prices such as competitions among companies in the same businesses and supply and demand balances. A unit price per bit of the CAM is about twenty times as high as that of the SRAM because of product cost.

In the memory LSIs, it is possible to keep fixed prices and manufacturing cost even if a memory capacity increases to twice to four times as large as those of previous ones. This mainly depends on a technology for refining and improvement of a yield. The refining technology involved in formation of transistors, wiring layers, and the like has significantly improved the number of elements and a memory capacity mountable per a unit area. On the other hand, the increase in a mounted capacity means an increase in sensitivity for adhesion of dust (particulates) that is a main cause of defects affecting a manufacturing yield. Thus, the manufacturing yield is extremely reduced. For example, as the refining technology advances to reduce a size to 0.25 micrometer, 0.15 micrometer, and 90 nanometers, a memory capacity mountable per a unit area increases. However, in general, a test yield in manufacturing decreases. Nevertheless, a situation is different in the case of the memory LSIs.

In the case of the memory LSIs, a test process in manufacturing is divided into a pre-test process and a post-test process. Pre-test indicates a test and a yield before remedial measures (repair) at the point when a manufacturing process ends. Post-test indicates a test and a final yield after remedial measures after the pre-test. This repair technology itself makes it possible to keep the substantially fixed market prices of the memory LSIs in these days.

For example, when it is assumed that pre-test yields of the memory LSIs in the technologies for 0.25 micrometer, 0.15 micrometer, and 90 nanometers are 60%, 50%, and 40%, respectively, remedies by repair measures increase by 25%, 35%, and 40%. As a result, post-test yields indicate a fixed value of 85%. Consequently, it is possible to realize substantially fixed manufacturing cost regardless of a mounted memory capacity. As in this example, a more refined technology contributes to a repair technology more. For the CAM, a fixed cost structure and a fixed market price cannot be kept when a mounted capacity increases. A reason for this may have a significant relation with the repair technology.

Data writing in and readout from the CAM are executed for a data sequence selected by a decoder. On the other hand, searches are executed for the CAM array simultaneously and in parallel. As a result, an address with all data matching is encoded and output to the outside. In other words, whereas only a decoder is adjacent to a memory array of a usual memory (DRAM or SRAM), a decoder and an encoder are adjacent to a CAM memory array. In addition, in the case of the TCAM, as described above, a plurality of data sequences are often hit simultaneously at the time of search according to the effect of the "X" value. Thus, a priority encoder that encodes data matching at "0" and "1" with the least "X" value as a final address is generally adopted.

In this case, mounting of the priority encoder reduces an area occupied by a memory cell. For example, in the case of the 18M bit TCAM using the 0.13 micrometer technology, a decoder has an occupied area of 0.03 as opposed to a TCAM cell sub-array area 1. The priority encoder has an occupied area of 0.19. As a general technology for the decoder, other addresses are simultaneously activated and a block is selected again in an I/O part. However, in the priority encoder, an encoder cell has to be mounted on each address.

As described above, an array constituting the CAM requires signal wiring of the search line SL and the match line ML other than the bit line BL and the word line WL. In other words, for example, when the TCAM is created based on a technology in which the SRAM is manufactured with four layers of wiring, normally, a manufacturing technology for six layers of wiring is required. This complicates processes. This means that the CAM memory cell becomes excessively sensitive to adhesion of dust (particulates). Even if the CAM is manufactured in a factory where a frequency of dust generation is equivalent to that for the SRAM, a manufacturing yield for the CAM is low compared with that of the SRAM. It goes without saying that it is possible to forcibly create a CAM memory cell with four layers of wiring. However, in that case, a cell area significantly increases and, eventually, manufacturing cost per bit increases.

A serious problem in realizing a reduction in manufacturing cost for the CAM is that it is difficult to adopt a remedial technology (a repair technology) by mounting redundant circuits. In the SRAM, even if dust (particulates) adheres to a memory cell to cause a defect, it is possible to behave as if there is no defect by replacing the memory cell or a memory cell group with redundant circuits prepared in an entirely difference place. However, in the CAM, various test methods are proposed (e.g., Japanese Patent Application Laid-Open Nos. H9-180498, H6-131897, H8-147999, 2002-260389, and H5-190788). However, since there are several technical problems, it is difficult to apply the repair technology to the test methods.

To perform remedies using the repair technology, first, an address having a defect has to be accurately recognized by a test. In this regard, for the SRAM or an SRAM unit in the CAM cell array, it is possible to perform writing and readout in units of bit. Thus, if writing and readout for each address and bit are repeated, it is possible to relatively easily recognize and specify a defective address. However, in a search unit of the CAM, such accurate recognition of a defective address is not easy.

As explained with reference to FIG. 27, when all data sequences in a large number of CAM cells (data sequences of the CAM) connected in parallel in a wired-OR connection system and search request data sequences match for each bit, the match line ML maintains the high level to which the match line ML is pre-charged. Conversely, if at least one bit does not match, the match line ML discharges to be at the low level.

Therefore, for example, when the match line ML discharges because of a certain kind of defect, if the defect is only one bit, it is possible to detect a defective address by rewriting data bit by bit after setting an expected value to a "HIT state". However, if at least another one bit of MISS is present, the match line ML discharges from the MISS bit. Thus, it is impossible to detect a cell including a search port having a defect.

The above is a problem of the CAM cells connected to the match line ML in the horizontal direction in the wired-OR connection system. The priority encoder present in the vertical direction also makes it difficult to apply the repair technology. There are two aspects in the difficulty in applying the repair technology.

In a first aspect of the priority encoder that makes it difficult to apply the repair technology, since cells of the priority encoder communicate with cells above and below the cells for priority control, it is not allowed to move the priority encoder to an entirely different place when a defect occur. Therefore, in the CAM, for example, as described in U.S. Pat. No. 6,751,755 (FIG. 31), the remedial technology by mounting redundant circuits is usually adopted in a memory array but is not adopted in the priority encoder in which occupancy cannot be neglected compared with the decoder. Thus, a fall in cell occupancy directly means a fall in a manufacturing yield.

FIG. 31 is a block diagram showing a conventional example for improving the manufacturing yield of the CAM. In FIG. 31, data sequences RML0 and RML1 read out from redundant memory arrays by REDUNDANT ROW0 AND REDUNDANT ROW1 are amplified by sense amplifiers RSA0 and RSA1 corresponding to the match line outputs Rmatc0 and Rmatch1 on a redundancy side. On the other hand, data sequences ML0 to MLn readout from an original memory array are amplified by sense amplifiers SA0 to San to be match line outputs Match0 to Matchn on a memory array side.

Selectors 114-0 to 114-n are provided between this signal and input signal lines PEln0 to PElnn to a PRIORITY ENCODER. The selectors 114-0 to 114-n connect a Match side to the input signal lines PEln0 to PElnn when there is no defect and connect a Rmatch side to the input signal lines PEln0 to PElnn when a defect occurs and repair is necessary. According to this constitution, a priority relation with the cells above and below necessary in operating the CAM is observed in the PRIORITY ENCODER even after the repair.

FIG. 32 is a block diagram showing an example of a case in which the memory cell occupancy is increased in the CAM. Usually, in a design of a memory LSI, an array arrangement and a sub-array arrangement of a memory are devised with priority given to cell occupancy. When a mounted capacity of the CAM increases, occupancy of the priority encoder is reduced to increase the memory cell occupancy according to, for example, a method shown in FIG. 32.

In FIG. 32, 110_00 to 110_0n, 110_10 to 110_1n, and 100_m0 to 110_mn are divided sub-arrays. Redundant memory arrays 108 are provided in the respective sub-arrays. Match lines of the sub-arrays 110_00 to 110_0n are connected to a common match line 105_0 via match amplifiers 103_00 to 103_0n. Match lines of the sub-arrays 110_10 to 110_1n are connected to a common match line 105_1 via match amplifiers 103_10 to 103_1n. Match lines of the sub-arrays 110_m0 to 110_mn are connected to a common match line 105_m via match amplifiers 103_m0 to 103_0n. The common match lines 105_0 to 105_m are connected to the priority encoder 104. In this way, a method of layering match lines and, in the example shown in FIG. 32, commonly connecting outputs of the match amplifiers 103_00 to 103_0m, to which local match lines are connected, to the global match line 105_0 and then inputting the outputs to the priority encoder 104 is also adopted.

A second aspect of the priority encoder that makes it difficult to apply the repair technology is related to an algorithm for determining a priority. When a plurality of addresses are simultaneously hit rather than a single address as a result of execution of a search instruction and a plurality of match lies ML maintain the high level, as described above, usually, the priority encoder preferentially outputs a smallest address. As a result, in a large number of address groups other than the prioritized address, it is neglected whether a search result is HIT or MISS as well as whether operations of the addresses normally function. In this way, the function of the priority encoder hinders easiness of confirmation that should be the essence of the defect detection test.

However, concerning the reduction in power consumption, the technology described in U.S. Pat. No. 6,324,087 cannot easily change table sizes for respective applications. For example, from a viewpoint of an application, a table size required for filtering is twice or more as large as that for L2 and L3. Since filtering search is also diversified, it is desirable to perform control with various degrees of freedom. For example, an entire filtering table is set as an object of search or the filtering table is layered to set only a part of the table as an object of search.

The technology described in U.S. Pat. No. 6,470,418 can program a first CAM array data sequence according to a table size desired by a user. Thus, it is possible to designate a table size with a high degree of freedom. It is possible to avoid the problem in the technology described in U.S. Pat. No. 6,324,087. However, since all data sequences have extended CAM data sequences, cost overhead in terms of hardware for the extended CAM data sequences is large.

Concerning manufacturing cost for the CAM, as described above, the number of process layers increases because of complexity of the CAM memory cell, a yield falls because of the multi wiring layer structure, and it is difficult to adopt the remedial technology by mounting the redundant circuits equivalent to other memories for priority control. Therefore, remedial measures in the CAM are extremely poor compared with the other memories (SRAM and DRAM) and a manufacturing yield of the CAM is extremely low compared with the other memories. As a result, manufacturing cost per bit increases and a market price for the CAM is high.

In the technology described in U.S. Pat. No. 6,751,755 for improving a manufacturing yield of the CAM, as described above, it is possible to repair a defect in a memory area. However, it is impossible to repair a defect that occurs in the priority encoder or the sense amplifier. For example, in the 18M bit TCAM using the 0.13 micrometer technology, an area ratio between the memory array and the sense amplifier and priority encoder is about 5:1. Compared with an area ratio between the memory array and the decoder of 39:1, it goes without saying that the repair technology is required for the priority encoder and the match amplifier (the sense amplifier) peculiar to the CAM.

In the method shown in FIG. 32 for increasing memory cell occupancy of the CAM, signal wiring such as the global match line is required. This further deteriorates durability against adhesion of particulates.

In general, failures distinguished by a result of a test are roughly classified into a functional failure (hereinafter, "operation functional failure") and a marginal failure (hereinafter, "operation marginal failure"). The operation functional failure indicates a hardware error that can be always observed under any test conditions such as temperature and voltage and is often caused by a process. On the other hand, the operation marginal failure is reproduction of a failure only under a certain condition such as a high operation frequency region or a high voltage side and is often caused by design.

In production, the categorization of the operation functional failure and the operation marginal failure is an important factor that should be evaluated in production management. For example, when the operation functional failure always occurs at a high failure rate, technical improvement is required for the process technology. When a failure rate of the operation functional failure is not so high but only a failure rate of a certain kind of operation marginal failure is high, it is possible that the failure is caused by some design deficiency peculiar to a product. Thus, an analysis and improvement from that aspect are performed. Usually, the operation marginal failure should transition at a failure rate lower than that of the operation functional failure. If a process technology is identical, a significant difference should not occur in a manufacturing yield depending on a product.

Concerning a test, as details of an actual test time, a test for detecting the operation marginal failure is more complicated than a test for detecting the operation functional failure. Thus, a test time for the operation marginal failure is longer. This is because a certain type of accelerated test condition peculiar to the operation marginal failure is created. In the SRAM and the DRAM, other than the operation functional failure, the operation marginal failure and tests for detecting the operation marginal failure are often studied. However, there is almost no study report concerning the operation marginal failure for the CAM and a test method for detecting the operation marginal failure.

Actually, a system environment in which the CAM is used is far stricter than a system environment in which the SRAM and the DRAM are used. This is because, as described above, since electric power equal to or larger than 10 watts is consumed in the single CAM, the power consumption significantly affects an operation margin of not only the LSI but also power supply impedance including a board. It is sufficiently possible that a CAM that has passed a test on a factory shipment test board may have the operation marginal failure on a system board used by a user. Therefore, it is meaningful in securing a quality after product shipment for the CAM to distinguish the operation functional failure and the operation marginal failure on a system and implement a test that can detect the failures.

SUMMARY OF THE INVENTION

It is an object of the present invention to at least solve the problems in the conventional technology.

A content-addressable-memory device according to one aspect of the present invention includes a plurality of content-addressable-memory sub-arrays that simultaneously performs a parallel comparison between a plurality of data sequences arranged in a row direction of memory cells storing three values of "1", "0", and "X" and a search data sequence input from outside, and outputs a result of the comparison for each of the data sequences; a first input pin to which the search data sequence is input; and a second input pin to which a search data sequence arbitrarily designating a content-addressable-memory sub-array is input. Each of the content-addressable-memory sub-arrays includes an activation control unit that controls activation of the content-addressable-memory sub-arrays based on the search data sequence input from the second input pin.

A content-addressable-memory device according to another aspect of the present invention includes a plurality of content-addressable-memory sub-arrays that simultaneously performs a parallel comparison between a plurality of data sequences arranged in a row direction of memory cells storing three values of "1", "0", and "X" and a search data sequence input from outside, and outputs a result of the comparison for each of the data sequences; and a plurality of priority encoders that is provided in a one-to-one relation with each of the content-addressable-memory sub-arrays, and performs a processing for remedying a defect that occurs in the content-addressable-memory sub-arrays or the priority encoders in a process of receiving a result of the comparison for each of the data sequences, determining an address to be output by priority when the data sequences match in a plurality of addresses, and encoding the address.

A content-addressable-memory device according to still another aspect of the present invention includes a plurality of content-addressable-memory cells for storing data; and a test mechanism that checks soundness of all of the content-addressable-memory cells, and specifies a defective address.

A remedial method for a content-addressable-memory device, according to still another aspect of the present invention, includes shipping including performing a writing operation and a search operation using continuous two clocks for each content-addressable-memory cell, storing a defective address detected at the performing in a storing unit that is accessible from outside, and shipping the content-addressable-memory device with storing unit in which the defective address is stored; and exploring measures for avoiding the defective address with reference to the storing unit on a user side.

A remedial method for a content-addressable-memory device, according to still another aspect of the present invention, includes shipping including providing a software repair area for exploring software repair measures in an accessible manner from outside, performing a writing operation and a search operation using continuous two clocks for each content-addressable-memory cell, storing a defective address detected at the performing in a storing unit that is accessible from outside, and shipping the content-addressable-memory device with storing unit in which the defective address is stored; and accessing the software repair area based on the defective address stored at the storing, to explore repair measures on a user side.

A remedial method for a content-addressable-memory device, according to still another aspect of the present invention, shipping including applying hardware repair measures to a defective address detected in a manufacturing process, and shipping the content-addressable-memory device with the hardware repair measures applied to the defective address; and exploring, when a defective address is detected on a user side, measures to avoid the defective address as a system.

A remedial method for a content-addressable-memory device, according to still another aspect of the present invention, shipping including providing a software repair area for exploring software repair measures in an accessible manner from outside, applying hardware repair measures to a defective address detected in a manufacturing process, and shipping the content-addressable-memory device with the hardware repair measures applied to the defective address; and exploring, when a defective address is detected on a user side, repair measures by accessing the software repair area based on the defective address.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 28 is a truth table for explaining a relation between a stored value and a search value of a TCAM unit cell shown in FIG. 27;

DETAILED DESCRIPTION OF THE PREFERRED EMBODIMENTS

Exemplary embodiments of the present invention are explained in detail below with reference to the accompanying drawings.

Figure 1:
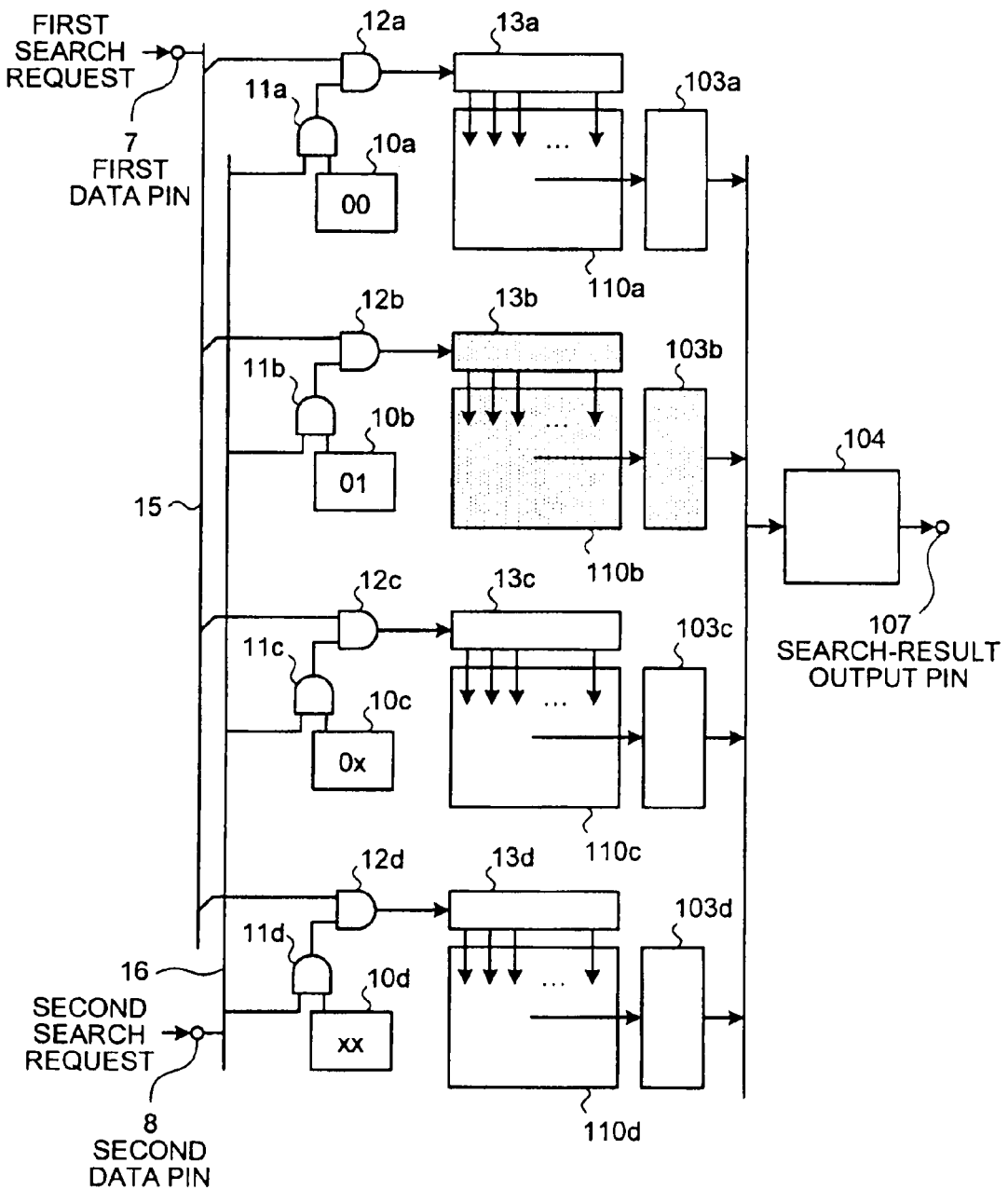
FIG. 1 is a diagram of a main part constitution of a CAM device according to a first embodiment of the present invention.
Figure 12:
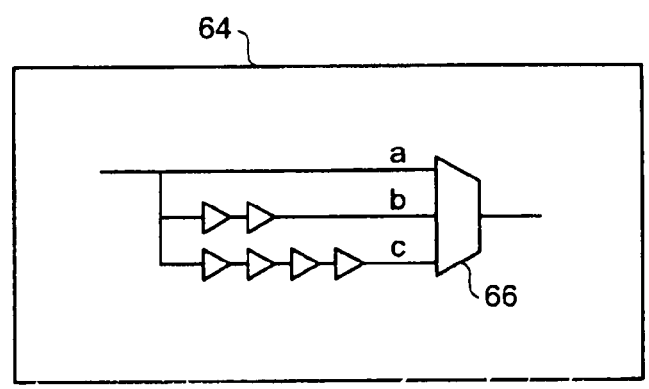
FIG. 12 is a circuit diagram of a specific example of a constitution of a test circuit shown in FIG. 11.

FIG. 1 is a diagram of a main part constitution of a CAM device according to a first embodiment of the present invention. In FIG. 1, components identical with or equivalent to those in the conventional example shown in FIG. 12 are denoted by the identical reference numerals and signs. According to the first embodiment, as shown in FIG. 1, low power consumption is realized when the CAM array 110 includes the four sub-arrays 110a, 110b, 110c, and 110d as in the conventional example in FIG. 12.

As shown in FIG. 1, in the CAM device according to the first embodiment, search-line driving circuits 13a to 13d are provided in the respective sub-arrays instead of the search-line driving circuits 102a to 102d in the conventional example in FIG. 12. Three-value memories 10a to 10d, matching comparators 11a to 11d, and matching comparators 12a to 12d are added. In the CAM device according to the first embodiment, a first data pin 7 serving as a node to which a first search request is input and a second data pin 8 serving as a node to which a second search request is input are provided. A bus 15 is connected to the first data pin 7 and a bus 16 is connected to the second data pin 8. Activation for each of the sub-arrays is controlled by this constitution to realize low power consumption. The first search request corresponds to the original search request in the conventional example in FIG. 12. The second search request is a data sequence for selecting a sub-array. In FIG. 1, since a CAM array is divided into four sub-arrays, the second search request is a 2-bit data sequence.

Three values of "0", "1", and "X" are stored in the three-value memories 10a to 10d. Note that, in FIG. 1, since the CAM array is divided into four sub-arrays, the three-value memories 10a to 10d have 2-bit length. Two values of the three values of "0", "1", and "X", are stored in the three-value memories 10a to 10d. In the example shown in the figure, "00" is stored in the three-value memory 10a for the sub-array 110a, "01" is stored in the three-value memory 10b for the sub-array 110b, "0X" is stored in the three-value memory 10c for the sub-array 110c, and "XX" is stored in the three-value memory 10d for the sub-array 110d.

One of the inputs to the matching comparators 11a to 11d are held values of the three-value memories 10a to 10d and other of the inputs are data sequences according to the second search request sent to the bus 16. One of the inputs to the matching comparators 12a to 12d are outputs of the matching comparators 11a to 11d and other of the inputs are data sequences according to the first search request sent to the bus 15. Outputs of the matching comparators 12a to 12d are input to the search-line driving circuits 13a to 13d.

Figure 2:
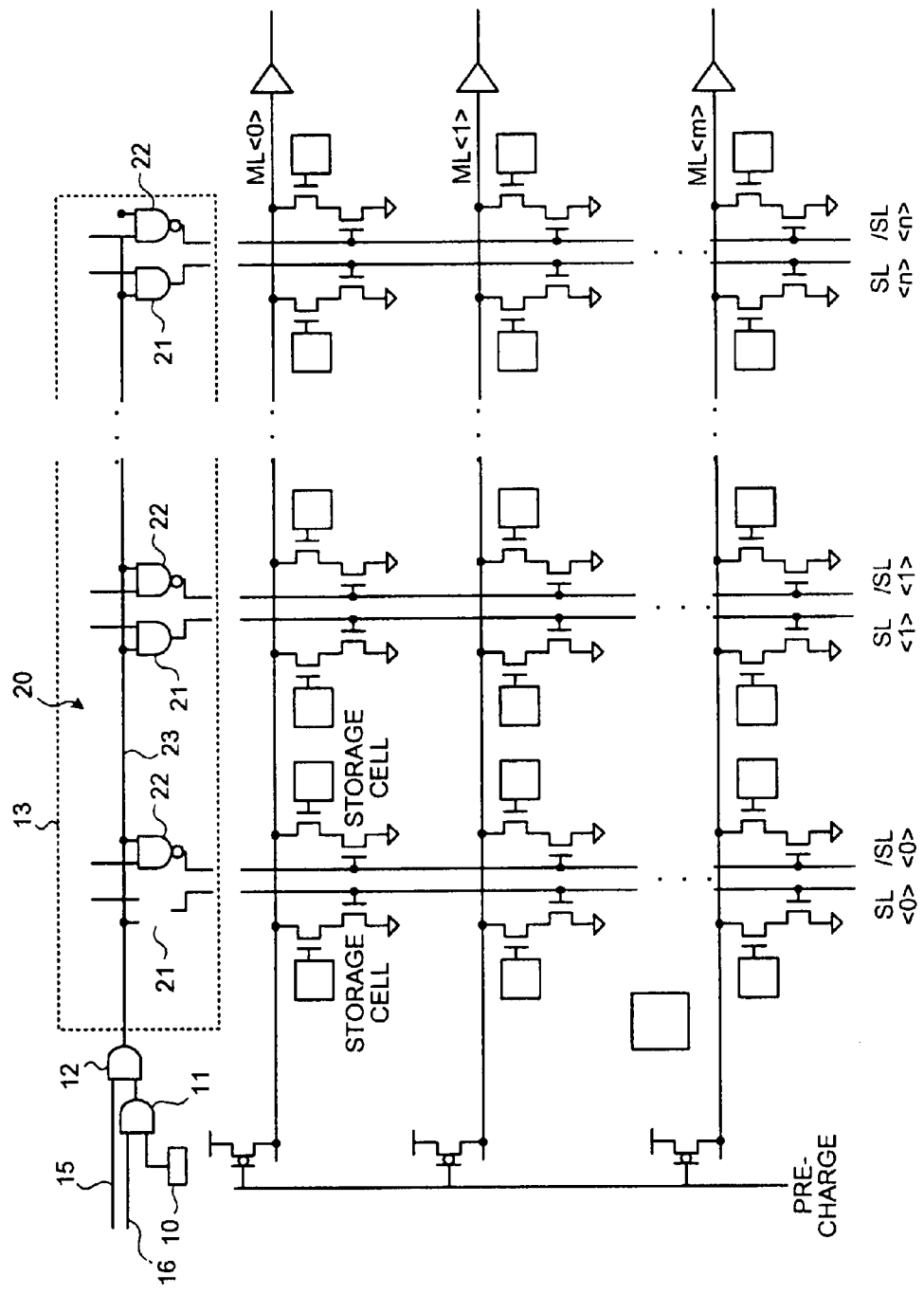
FIG. 2 is a main part circuit diagram of an example of a constitution of a search line activation control circuit included in the CAM device shown in FIG. 1.

FIG. 2 is a main part circuit diagram of an example of a constitution of a search line activation control circuit included in the CAM device shown in FIG. 1. In FIG. 2, in the search-line driving circuit 13, a search line activation control circuit 20 is added in the search-line driving circuit 102 in the conventional example in FIG. 12. The search line activation control circuit 20 includes an AND circuit 21 provided at a driving end of the search line SL and a NAND circuit 22 provided at a driving end of the search line /SL. In short, a logical value level for the search lines SL and /SL generated according to the data sequence according to the first search request is applied to one input ends of the AND circuit 21 and the NAND circuit 22 as in the past. The other input ends of the AND circuit 21 and the NAND circuit 22 are connected to a matching judging line 23 connected to the output end of the matching comparator 12.

According to the constitution described above, first, in the matching comparators 11a to 11d, matching judgment for the held values of the three-value memories 10a to 10d and the data sequence according to the second search request sent to the bus 16 is performed. The matching comparator 11 that detects matching sets an output to an H level. In FIG. 1, the matching comparator 11b in the three-value memory 10b detects matching and sets an output to the H level. The other matching comparators 11a, 11c, and 11d cannot detect matching and set outputs to an L level, respectively. Consequently, one of the four sub-arrays is selected.

In the selected one sub-array, the matching comparator 12 corresponding to the sub-array captures the data sequence according to the first search request sent to the bus 15 and sends the data sequence to the matching judging line 23. Thus, in the search-line driving circuit 13 corresponding to the sub-array, the search lines SL and /SL are controlled to be driven in the search line activation control circuit 20. Matching comparison with the data sequence in the selected one sub-array is performed. Maintenance of the H level of the match line ML and a discharge operation for setting the match line ML to the L level are performed based on a result of the comparison.

On the other hand, in the three sub-arrays not selected, the matching comparators 11 corresponding to the sub-arrays set outputs to the L level. Thus, the matching comparators 12 corresponding to the sub-arrays do not capture the data sequence according to the first search request sent to the bus 15 and hold the matching judging line 23 at the L level. Therefore, the search-line driving circuits 13 corresponding to the sub-arrays, the search line activation control circuit 20 does not operate.

In other words, in the three sub-arrays not selected, all the search lines SL and /SL are deactivated. The match lines ML in the sub-arrays maintain the H level. Power consumption occurs only in the selected one sub-array and does not occur in the three sub-arrays not selected.

In this way, according to the first embodiment, the three-value memories, the matching comparators, and the search line activation control circuits are provided for the respective divided sub-arrays. First, an arbitrary sub-array is selected according to matching comparison of the second search request that can arbitrarily designate a plurality of divided sub-arrays and held values of the three-value memories. In the sub-array matching comparator selected, the data sequence according to the first search request is given to the search line activation control circuit. Thus, it is possible to realize low power consumption according to addition of simple hardware. In addition, it is possible to freely control the divided sub-arrays to be an object of search or not to be an object of search. Thus, when the CAM device is used for a path searching apparatus, it is possible to perform division following a degree of freedom required by an application.

Figure 3:
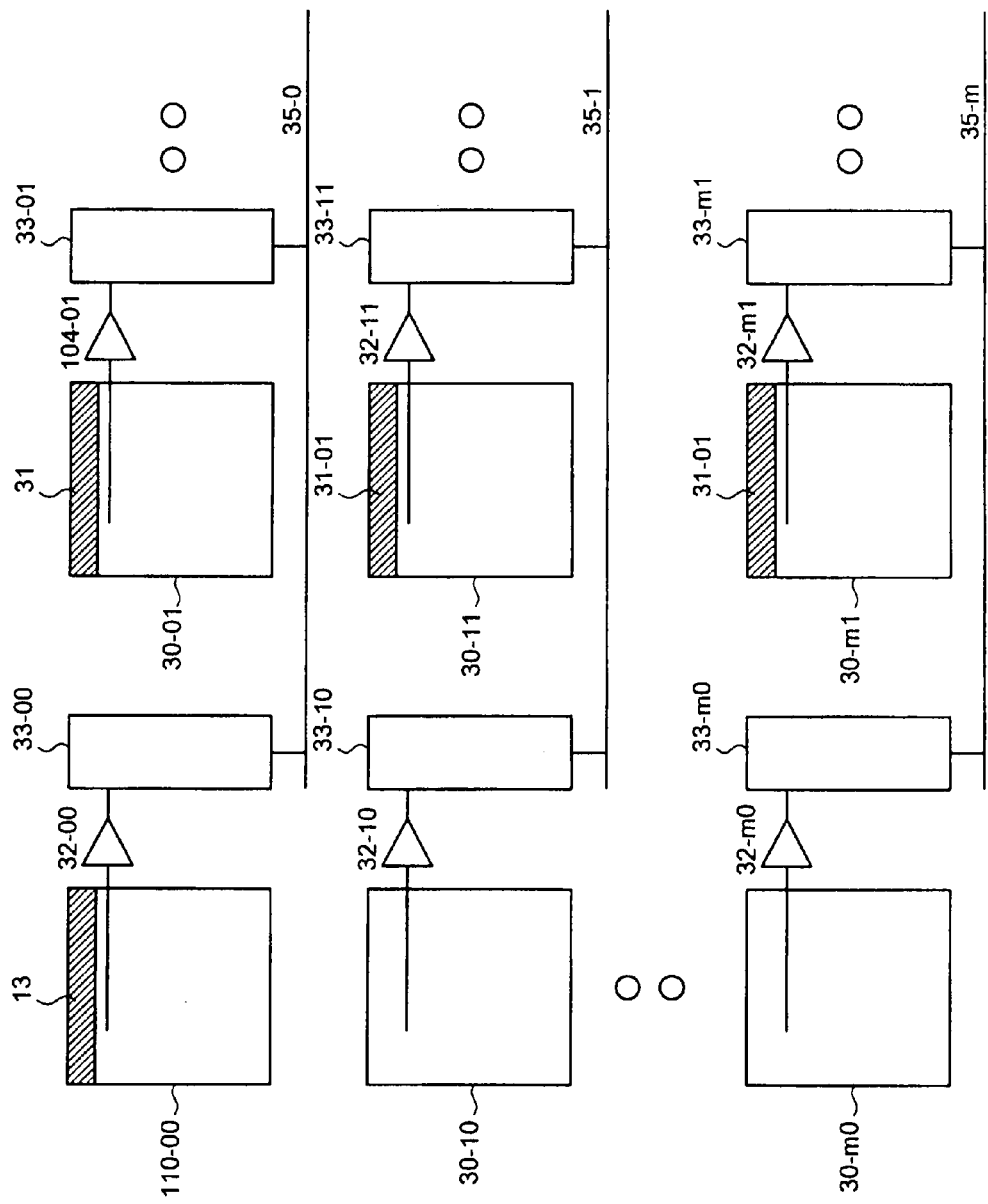
FIG. 3 is a diagram of a main part constitution of a CAM device according to a second embodiment of the present invention.

FIG. 3 is a diagram of a main part constitution of a CAM device according to a second embodiment of the present invention. According to the second embodiment, a CAM array is made redundant and a priority encoder that prevents improvement of a manufacturing yield is made redundant.

In FIG. 3, a CAM array is divided into a plurality of sub-arrays 30 (30_00, 30_01, ..., 30_10, 30_11, ..., 30_m1, and the like). Redundant circuits 31 are provided in the respective sub-arrays 30. The redundant circuits 31 are not provided in specific places as in the past but are created by preventing selection of a set of all memory cells (data sequences) in a row direction including a memory cell in which a defect actually occurs.

In the respective sub-arrays 30 (30_00, 30_01, ..., 30_10, 30_11, ..., 30_m1, ...), priority encoders 33 (33_00, 33_01, ..., 33_10, 33_11, ..., 33_m0, 33_m1, ...) are arranged in a one-to-one relation. Reference numerals 30 (32_00, 32_01, ..., 32_10, 32_11, ..., 32_m0, 32_m1, ...) denote match amplifiers that amplify signals of match lines.

Respective output ends of the priority encoders 33 (33_00, 33_01, ...) are connected to a common output line 35_0. Respective output ends of the priority encoders 33 (33_10, 33_11, ...) are connected to a common output line 35_1. Respective output ends of the priority encoders 33 (33_m0, 33_m1, ...) are connected to a common output line 35_m.

Figure 4:
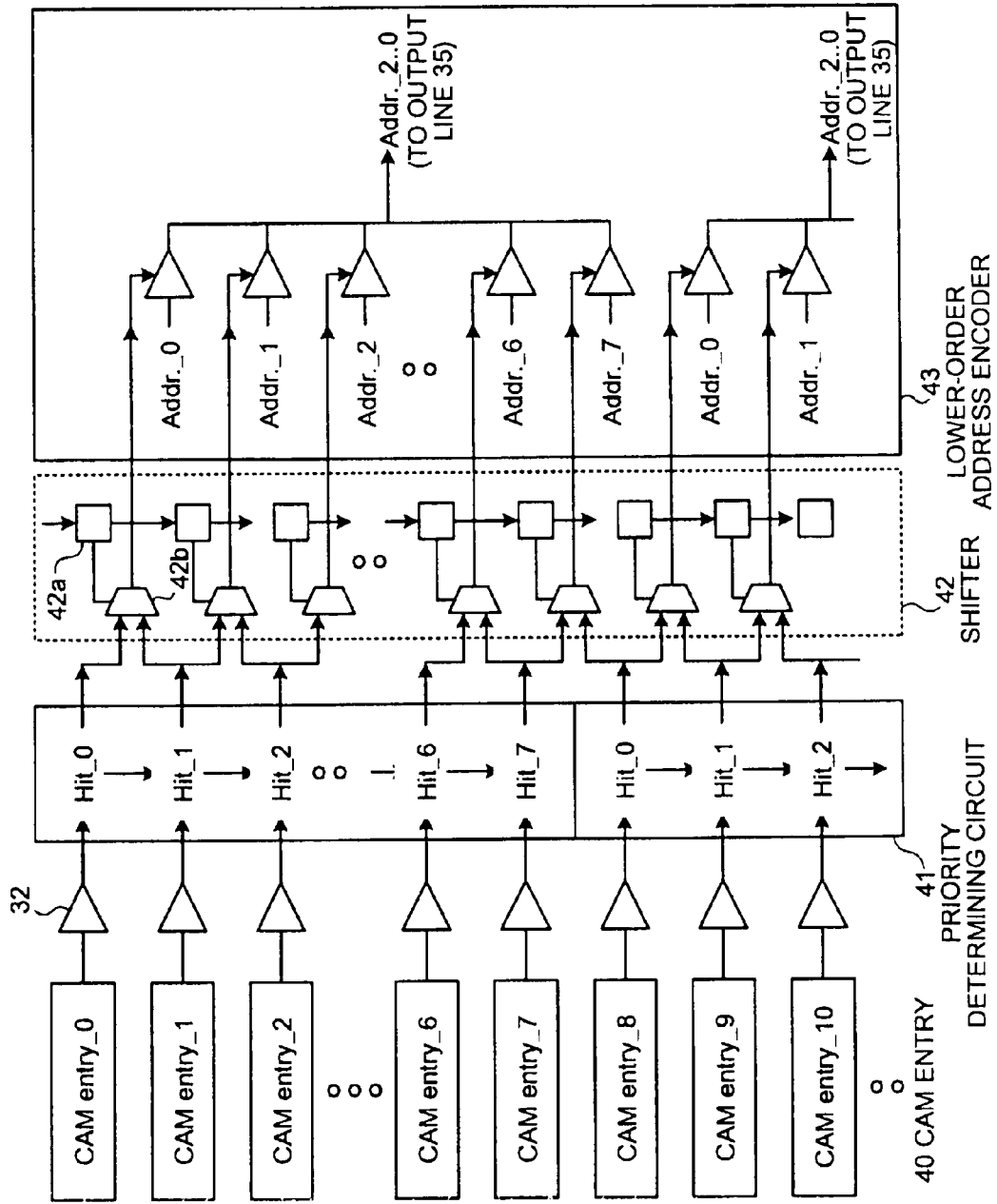
FIG. 4 is a diagram for explaining an example of a constitution of redundant priority encoders shown in FIG. 3 and a relation between the priority encoder and sub-arrays shown in FIG. 3.

FIG. 4 is a diagram for explaining an example of a constitution of the redundant priority encoders shown in FIG. 3 and a relation between the priority encoders and the sub-arrays shown in FIG. 3. In FIG. 4, a CAM entry 40 indicates a data sequence by a memory cell operated in a word line in a row direction in the sub-array 30. The data sequence corresponds to an address by the row decoder 106 shown in FIG. 8 in a one-to-one relation. A result of comparison of the data sequence and search data is a hit signal Hit of a match line arranged in parallel to the word line in a one-to-one relation. The hit signal Hit is input to the priority encoder 33 via the match amplifier 32.

The priority encoder 33 includes a priority determining circuit 41 that receives an output (the hit signal Hit) of the match amplifier 32, a shifter 42 that receives an output of the priority determining circuit 41, and a lower-order address encoder 43 that receives an output of the shifter 42 and sends an encode result to the output line 35.

Figure 5:
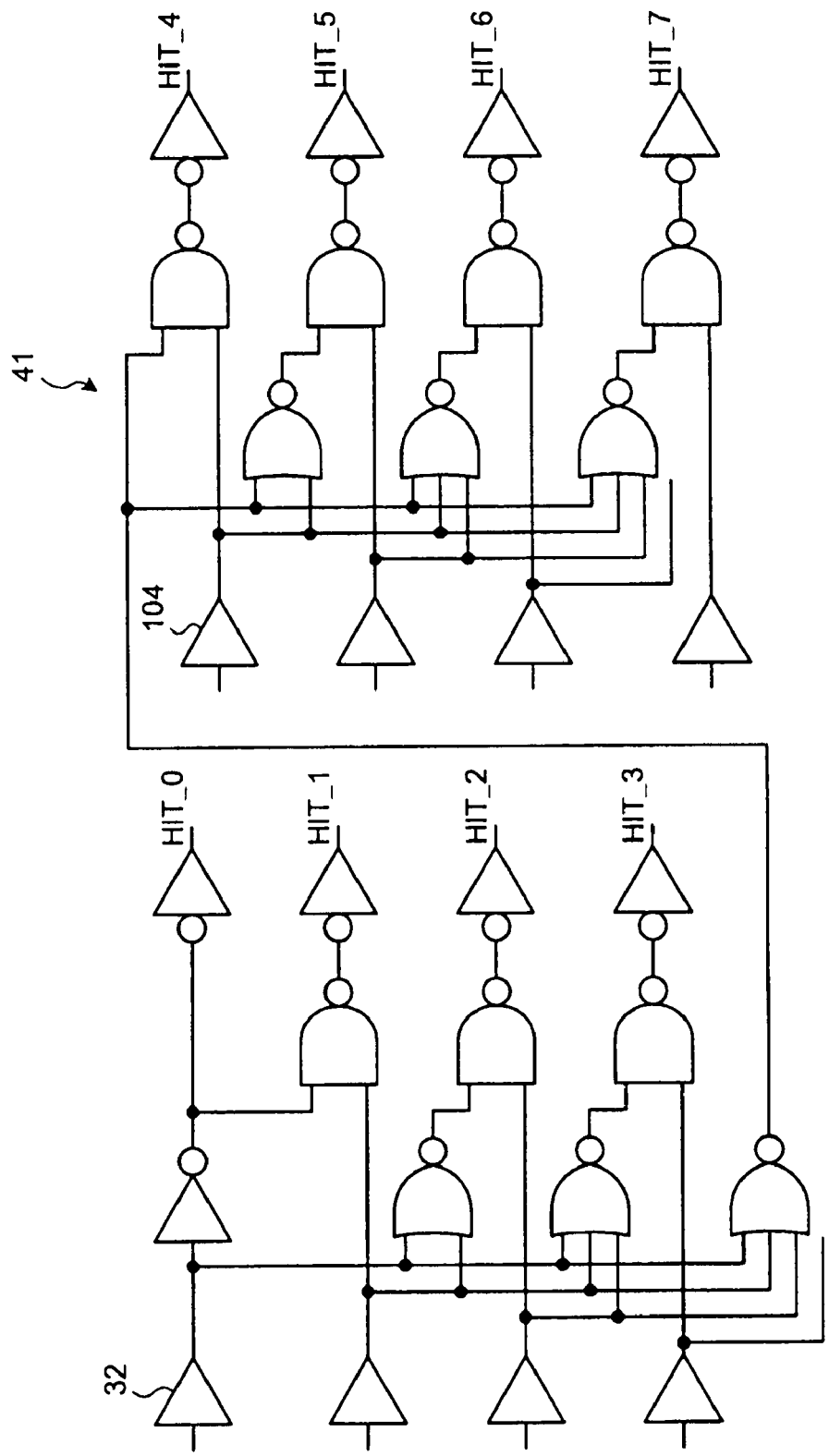
FIG. 5 is a circuit diagram of a specific example of a priority determining circuit shown in FIG. 4.

The priority determining circuit 41 is provided to be divided for each certain address length, for example, each eight addresses (hereinafter, "eight bits"), in the sub-array 30. FIG. 5 is a circuit diagram of a specific example of the priority determining circuit shown in FIG. 4. As shown in FIG. 5, the priority determining circuit 41 receives outputs (hit signals Hit) of the eight match amplifiers 32, determines priorities from a least significant bit in the eight bits to higher-order bits, and finally designates and outputs one address bit. According to this constitution, since priorities are determined for each eight bits, for example, an address to be preferentially output among a bit 0 to a bit 7 and an address to be preferentially output among a bit 8 to a bit 15 are present independently from each other.

The shifter 42 includes a shift register 42a and a selector 42b with two inputs and one output that uses a held value in the shift register 42a as a control signal. Information concerning where a defect occurs, which is detected in the test step, is set in the shift register 42a. For example, concerning a memory cell, a defective address detected by applying read and write to the CAM entry 40 is loaded to the shift register 42a by a method like fuse blow. Two outputs adjacent to each other as a high-order output and a lower-order output among outputs of the priority determining circuit 41 are input to respective input ends of the selector 42b, respectively. Consequently, in the shifter 42, it is possible to select an output other than the output of the priority determining circuit 41 related to the stored defect information. If the defect information relates to the CAM entry 40, the shifter 42 operates to avoid an entry (a data sequence) of a defective entry address stored. As shown in FIG. 4, this selection operation is applied to ten bits in total obtained by adding a high-order side one bit and a lower-order side one bit to the eight bit output of the priority determining circuit 41.

In FIG. 4, for example, when a defect occurs in an entry address 5, "0" is loaded to a shift stage in the zeroth bit to a shift stage in the fifth bit of the shift register 42a and "1" is loaded to a shift stage in the sixth bit and the subsequent shift stages. Then, in the selector 42b corresponding to the shift stage in the zeroth bit to the shift stage in the fifth bit of the shift register 42a, a high-order side outputs among the outputs of the priority determining circuit 41 is selected. In the selector 42b corresponding to the shift stage in the sixth bit and the subsequent shift stages of the shift register 42a, a lower-order side output among the outputs of the priority determining circuit 41 is selected. Thus, entry address 5 is not selected and input to the lower-order address encoder 43.

Figure 6:
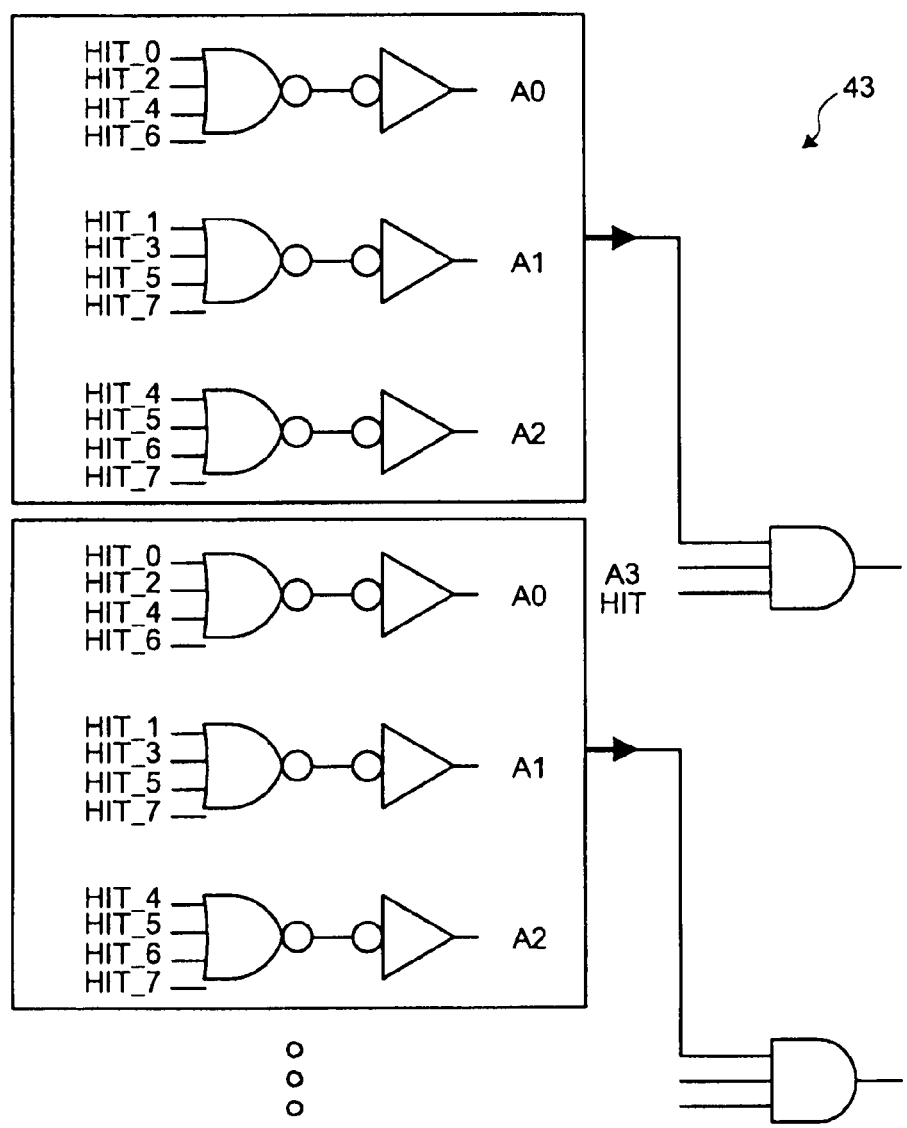
FIG. 6 is a circuit diagram of a specific example of a lower-order address encoder shown in FIG. 4.

FIG. 6 is a circuit diagram of a specific example of the lower-order address encoder shown in FIG. 4. The lower-order address encoder 43 is divided for each eight address bits in the same manner as the priority determining circuit 41. The lower-order address encoder 43 uses the same divided addresses as the priority determining circuit 41, uses an output of the selector 42b as a control signal, and decodes and outputs three bit addresses (A0 to A2) on the lower-order side. The bit address A3 and the subsequent bit addresses are output in the same manner as the time when no redundant circuit is provided.

The hit signals Hit passing through the shifter 42 have already been subjected to priority determining processing by a unit of eight bits. Thus, only one hit signal Hit is activated for eight bit addresses. The lower-order address encoder 43 performs encode of the bit addresses A0 to A2 using this signal. Since the addresses to be encoded are divided into blocks for each eight bits, it is possible to perform remedy by this unit.

It is possible to replace a defective address according to selection by the shifter 42 from ten bits in total obtained by adding a high-order one bit and a lower-order one bit to the finally output eight bits. The lower-order three bit addresses (A0 to A2), for which remedial processing by the unit of eight bits is completed in this way, appear in the output of the lower-order address encoder 43. For the bit address A3 and the subsequent bit addresses, priority determination is finally performed in the priority encoder 104 explained in the conventional example.

In this way, according to the second embodiment, the priority encoder is provided for each of the divided sub-arrays and the so-called local priority encoder is divided to encode an address by determining priorities for each fixed number of addresses, and an entry in which a defect occurs is stored to make it possible to avoid the entry, in which the defect occurs, in a process of determining priorities and encoding an address. Thus, it is possible to perform remedy whether a defect occurs in the memory cell in the sub-array and the priority encoder or the match amplifier interposed between the sub-array and the priority encoder.

In other words, it is possible to apply the remedial measures by the same redundant circuit as the memory LSI of the SRAM, the DRAM, or the like to the priority encoder. This makes it possible to improve a manufacturing yield of the CAM and expect a reduction in a bit unit price.

The method for low power consumption and the method for a redundancy constitution of the priority encoder for solving the first aspect of the priority encoder that makes it difficult to apply the repair technology have been explained. Methods of taking remedial measures for the operation functional failure and the operation marginal failure are explained as third to ninth embodiments. Outlines of the embodiments are as described below.

A third embodiment of the present invention (FIGS. 7 and 8) relates to a method of constituting a test circuit that makes accurate recognition of a defective address required for realizing remedy by the repair technology possible and can easily specify an address of a CAM cell in which the operation functional failure occur. A fourth embodiment of the present invention (FIGS. 9 and 10) relates to a method of constituting a test circuit that makes it possible to verify the HIT state and the MISS state in respective match lines to cope with the second aspect of the priority encoder that makes it difficult to apply the repair technology. A fifth embodiment of the present invention (FIGS. 11 to 16) relates to a method of constituting a test circuit that gives an acceleration condition for a failure to detect the operation marginal failure due to power supply noise caused by large power consumption apprehended in the CAM.

A sixth embodiment of the present invention (FIG. 17) relates to (A) a method of realizing quality maintenance for a system by making it possible to carry out an operation marginal failure detection test assuming a board condition at the time of mounting on the system on a user side, storing a result of the test and a defective address when a failure occurs, and making it possible to prevent use of the defective address from the system on the user side and (B) a method of realizing quality maintenance for a system by making it possible to carry out an operation marginal failure detection test assuming a board condition at the time of mounting on the system on a user side, storing a result of the test and a defective address when a failure occurs, and forming a software repair area, in which remedial measures can be taken based on the defective address from the system on the user side, in a CAMLSI.

A seventh embodiment of the present invention (FIGS. 18 and 19) relates to (A) a method of realizing quality maintenance for a system by remedying an operation functional failure detected in a manufacturing process in terms of hardware (hardware repair) to ship a product on a manufacturing side and applying, as a system, measures for avoiding an address of an operation marginal failure detected in an acceptance test on a user side and (B) a method of realizing quality maintenance for a system by providing a software repair area used by a user side in a CAMLSI, remedying an operation functional failure detected in a manufacturing process in terms of hardware (hardware repair) to ship a product on a manufacturing side, and remedying an address of an operation marginal failure detected in an acceptance test using the software repair area on the user side. An eighth embodiment of the present invention (FIGS. 20 to 22) and a ninth embodiment (FIG. 23) relate to a method of realizing improvement reliability and quality improvement by mounting both a hardware repair mechanism for remedying an operation functional failure and a software repair mechanism for remedying an operation marginal failure in a CAMLSI.

Figure 7:
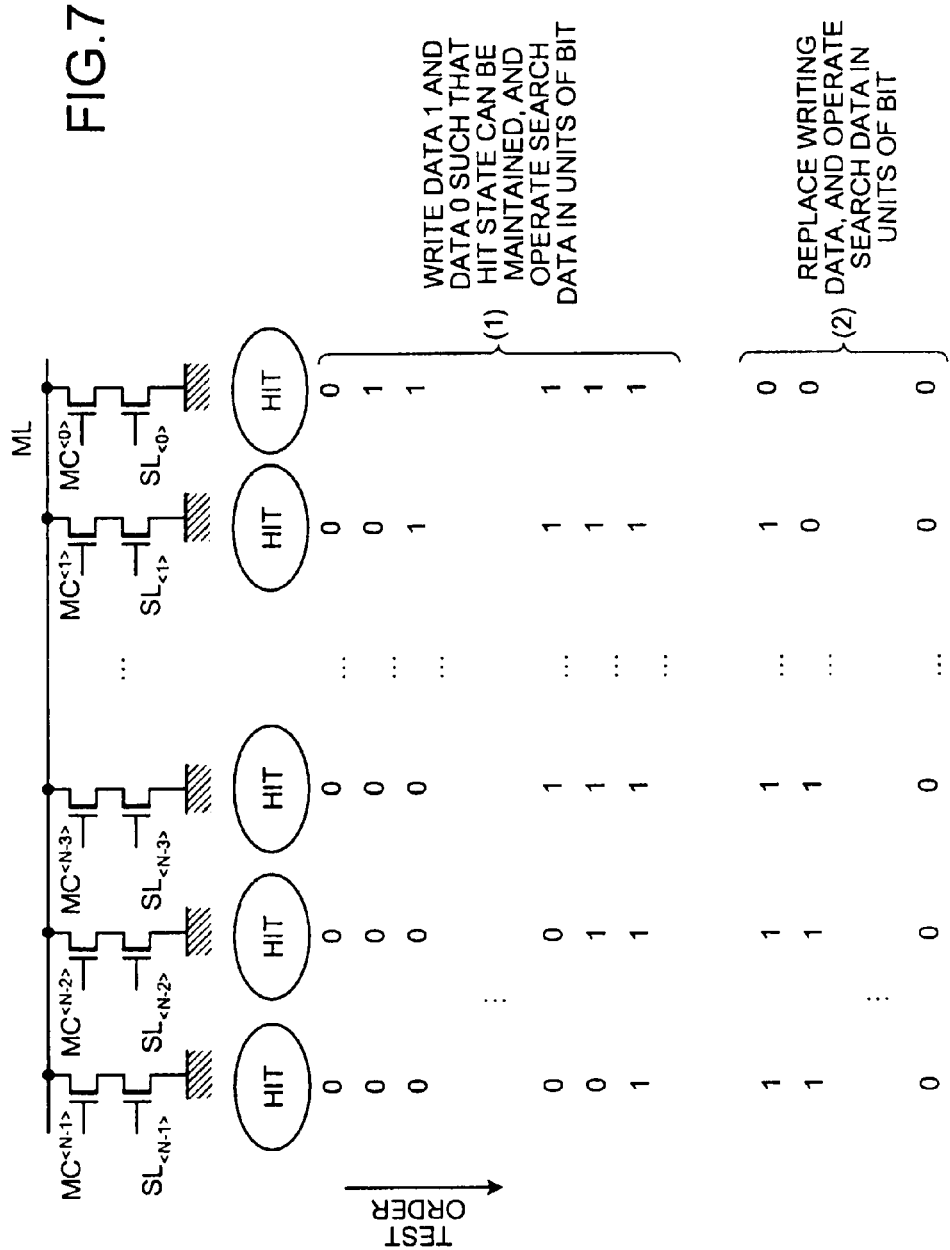
FIG. 7 is a diagram for explaining a test circuit for a HIT function among circuits for testing, for each match line, functions of all CAM cells included in a CAM device according to a third embodiment of the present invention.
Figure 8:
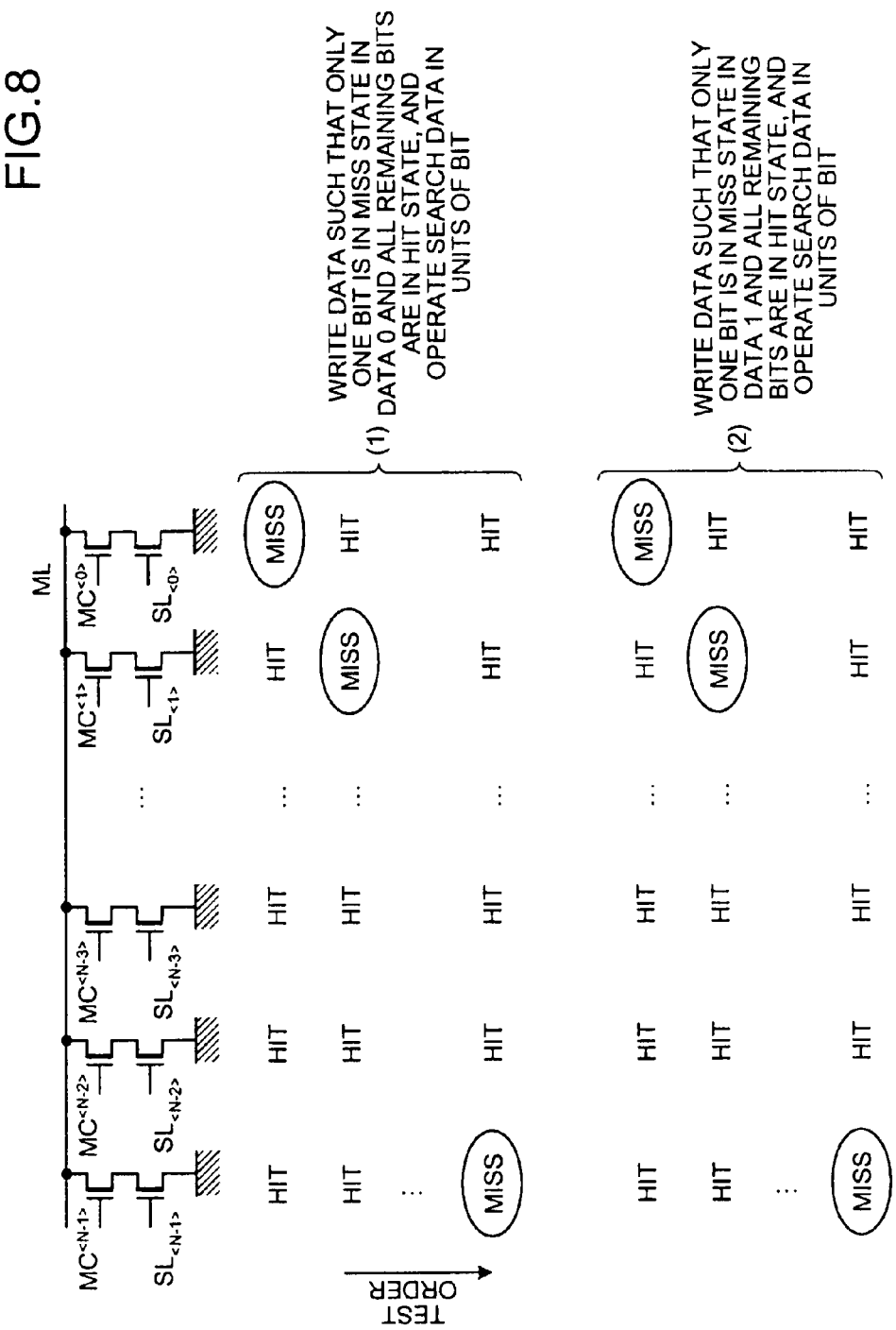
FIG. 8 is a diagram for explaining a test circuit for a MISS function among the circuits for testing, for each match line, functions of all the CAM cells included in the CAM device according to the third embodiment.

According to the third embodiment, circuits for testing functions of all CAM cells for each match line is explained with reference to FIGS. 7 and 8. FIG. 7 is a diagram for explaining a test circuit for a HIT function among the circuits for testing functions of all CAM cells for each match line. FIG. 8 is a diagram for explaining a test circuit for a MISS function among the circuit for testing functions of all CAM cells for each match line.

In FIGS. 7 and 8, N CAM cells from an address <0> to an address <N−1> connected in parallel to a certain one match line ML in a wired-OR connection system are shown. Each of the CAM cells are simplified and shown in the figures. In the CAM cell, a memory cell MC and a search transistor, to a gate electrode of which a search line SL is connected, are arranged in series between a match line ML and a ground potential (a ground).

The match line ML maintains a high level pre-charged in advance if all data sequences held by the memory cells MC of the large number of CAM cells connected in parallel in the wired-OR connection system and all search request data sequences carried on the search lines SL match (HIT) for each bit. Conversely, the match line ML discharges to be at a low level if at least one bit mismatches (MISS).

As described above, in this constitution, for example, when the match line ML discharges because of a certain kind of defect, if the defect is only one bit, it is possible to detect a defective address by rewriting search data bit by bit after setting an expected value to a "HIT state". However, if at least another one bit of MISS is present, the match line ML discharges from the MISS bit. Thus, it is impossible to detect a cell including a search port having a defect.

Thus, according to the third embodiment, first, as shown in FIG. 7, while keeping a state in which search results for all data sequences of the CAM are "HIT", the circuit checks whether the "HIT state" can normally function in units of bit by testing both search data 0 and search data 1 bit by bit for the data sequences of the CAM.

In FIG. 7, examples of the test are shown. As a test for a first time (1), the circuit prepares search data sequences with logical values varied by one bit each from a search data sequence with all "0" bits to a search data sequence with all "1" bits. In this order, the circuits writes the search data sequences with logical values varies by one bit each in the respective memory cells MC as data sequences of the CAM and adds search data sequences corresponding to the search lines SL to check presence or absence of the "HIT function" by a unit of one bit. As a test for a second time (2) in which data are replaced, the circuit prepares search data sequences with logical values varied by one bit each from a search data sequence with only a least significant bit "0" and the remaining all "1" bits to a search data sequence with all "0" bits. In this order, the circuit writes the search data sequences with logical values varies by one bit each in the respective memory cells MC as data sequences of the CAM and adds search data sequences corresponding to the search lines SL to check presence or absence of the "HIT function" by a unit of one bit.

When it is successfully checked whether the "HIT state" can normally function for all the cells, as shown in FIG. 8, conversely, while keeping a state in which only one bit of a search result is "MISS" for all the data sequences of the CAM, the circuit checks whether the "MISS state" can normally function in units of bit by testing both data 0 and data 1 bit by bit for data sequences of the CAM.

In FIG. 8, examples of the test are shown. As a test for a first time (1), the circuit writes search data sequences of the CAM, in which only one bit is in the "MISS state" when search data is 0 and all the remaining bits are in the "HIT state", in respective memory cells MC in order from a least significant bit to a most significant bit of the CAM cells and adds search data sequences corresponding to the search lines SL to check presence or absence of the "MISS function" by a unit of one bit. As a test for a second time (2) in which data are replaced, the circuit writes search data sequences of the CAM, in which only one bit is in the "MISS state" when search data is 1 and all the remaining bits are in the "HIT state", in respective memory cells MC in order from a least significant bit to a most significant bit of the CAM cells and adds search data sequences corresponding to the search lines SL to check presence or absence of the "MISS function" by a unit of one bit.

Consequently, it is possible to detect a failure of MISS with respect to HIT in units of bit. This makes accurate recognition of a defective address required in realizing remedy by the repair technology possible. It is possible to easily specify an address of a CAM cell having an operation functional failure.

Figure 9:
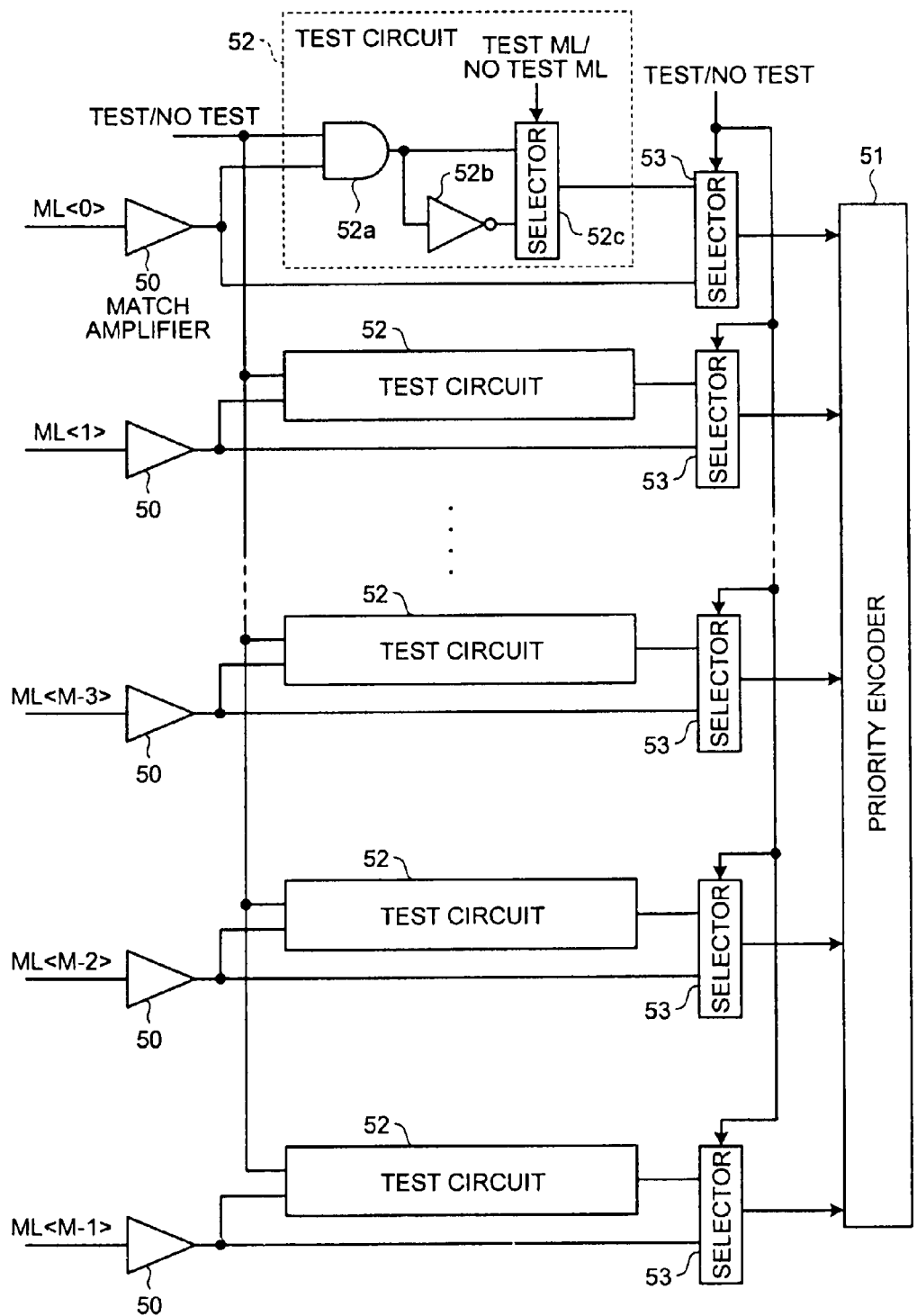
FIG. 9 is a diagram for explaining a constitution that makes it possible to verify a HIT state and a MISS state for each match line included in a CAM device according to a fourth embodiment of the present invention.

FIG. 9 is a diagram for explaining a constitution that makes it possible to verify a HIT state and a MISS state for each match line included in a CAM device according to a fourth embodiment of the present invention. According to the fourth embodiment, an example of a constitution in which a priority judging algorithm of a priority encoder copes with the second aspect that makes it difficult to verify the HIT state and the MISS state for each match line is explained.

As shown in FIG. 9, in the CAM device according to the fourth embodiment, when all match lines ML (M match lines ML from a match line ML <0> of an address 0 to a match line ML <M−1> of an address M−1) are connected to a priority encoder 51 via the match amplifiers 50, respectively, for each of the match lines ML, a test circuit 52, to which an output of the match amplifier 50 is branched and input, and a selector 53, to which an output of the match amplifier 50 and an output of the test circuit 52 are input, are provided between an output end of the match amplifier 50 and the priority encoder 51.

A mode designation signal (test/no test) designating a test mode and a normal operation mode is commonly input to each of the test circuits 52 and the respective selectors 53. The respective selector 53 operates to give an output of the test circuit 52 to the priority encoder 51 when the mode designation signal (test/no test) indicates "test (the test mode)" and give an output of the match amplifier 50 to the priority encoder 51 when the mode designation signal (test/no test) indicates "no test (the normal operation mode)".

Each of the test circuit 52 includes, for example, an AND circuit 52a, an inverter circuit 52b, and a selector 52c. One input of the AND circuit 52a is the mode designation signal (test/no test) and the other input there of is an output of the match amplifier 50. An output of the AND circuit 52a directly becomes one input of the selector 52c and becomes the other input of the selector 52c via the inverter circuit 52b. An output of each of the selector 52c is input to the selector 53 corresponding thereto as the output of the test circuit 52.

The AND circuit 52a captures the output of the match amplifier 50 into the test circuit 52 when the mode designation signal (test/no test) indicates the test mode and does not capture the output of the match amplifier 50 into the test circuit 52 when the mode designation signal (test/no test) indicates the normal operation mode. In the example shown in the figure, the mode designation signal (test/no test) is in a "1" level (also referred to as the H level) when the mode designation signal indicates the test mode and in a "0" level (also referred to as the L level) when the mode designation signal indicates the normal operation mode.

In each of the test circuits 52, when the mode designation signal (test/no test) indicates the test mode, a designation signal (test ML/no test ML) of the match line ML to be tested is individually input as a control signal for the selector 52c. The selector 52c operates to select the output of the AND circuit 52a when the designation signal indicates the "test ML" and select the output of the inverter circuit 52b when the designation signal indicates the "no test ML".

The designation signal (test ML/no test ML) of the match line ML to be tested is adapted to give the "test ML" to the selector 52c in one match line ML of attention and give the "no test ML" to the selector 52c in all the remaining match lines ML. Consequently, in the example shown in the figure, when the mode designation signal (test/no test) indicates the test mode, the selector 52c in the one match line ML of attention gives the H level output by the AND circuit 52a to the priority encoder 51 via the selector 53 corresponding thereto. On the other hand, the selector 52c in all the remaining match lines ML give the L level inversely output by the inverter circuit 52b to the priority encoder 51 via the selectors 53 corresponding thereto.

Figure 10:
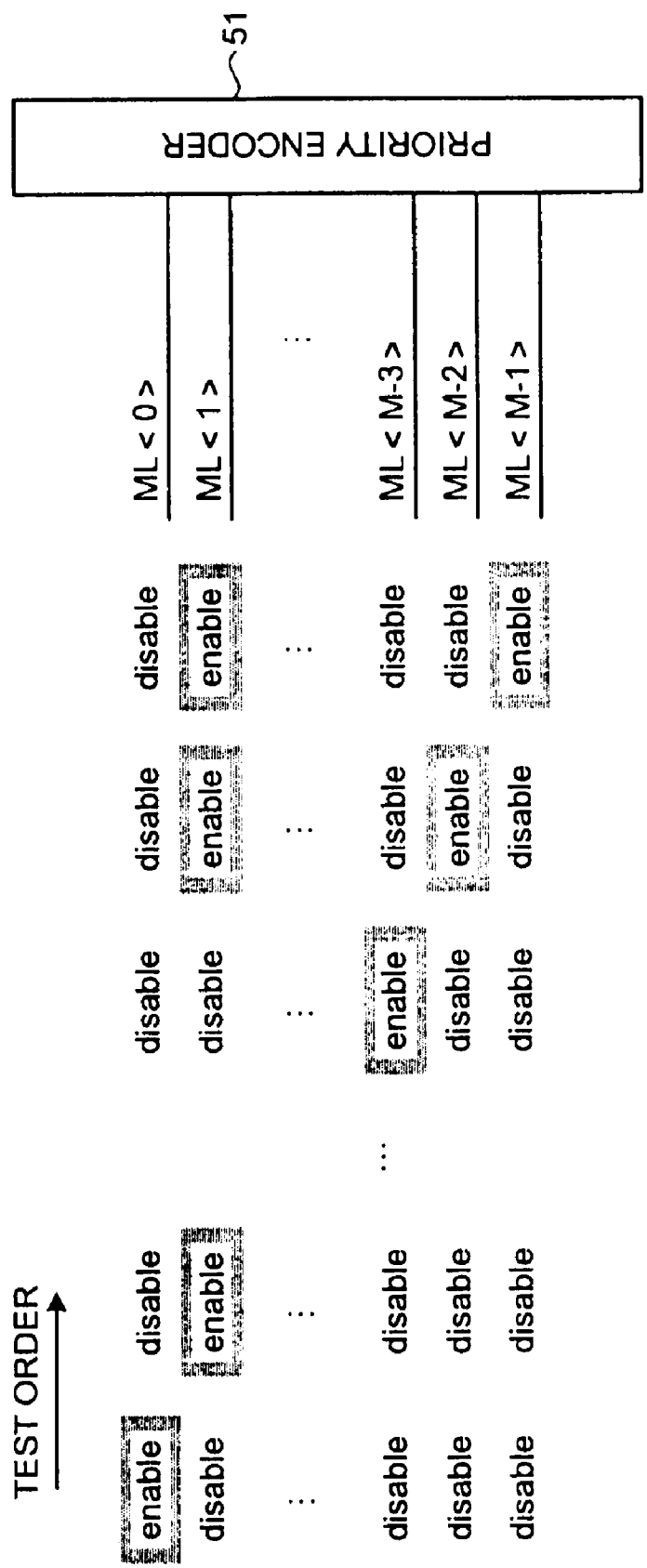
FIG. 10 is a diagram for explaining a test method by a test circuit shown in FIG. 9.

FIG. 10 is a diagram for explaining a test method by the test circuit shown in FIG. 9. In the test mode, the match lines ML of attention are designated in order one by one. As shown in FIG. 10, when it is assumed that all the match lines ML are designated in order from the match line ML<0> to the match line ML<M−1>, at the time of test of the match line ML<0>, the match line ML<0> is enabled and information of HIT is transmitted to the priority encoder 51. On the other hand, all of the match line ML<1> to the match line ML<M−1> are disabled, which means that the match lines are in the L level. Information of HIT is not transmitted to the priority encoder 51.

The same applies until the match line ML<M−1> is tested. Information of HIT in one match line ML is input to the priority encoder 51 in the test at each time. All the remaining match lines ML are in the L level. Information of HIT in those match lines ML is not input.

When there are a plurality of match lines ML indicating the HIT state, the priority encoder 51 preferentially selects a match line ML with a smallest address among the match lines ML. Thus, as described above, under the situation in which only one match line ML indicates the HIT state, the function of priority judgment always does not work and the priority encoder 51 simply functions as an encoder.

Therefore, since it is possible to recognize judgment on pass/fail for each match line ML, it is possible to easily carry out the detection test for an operation functional failure bit by bit as explained according to the third embodiment.

Figure 11:
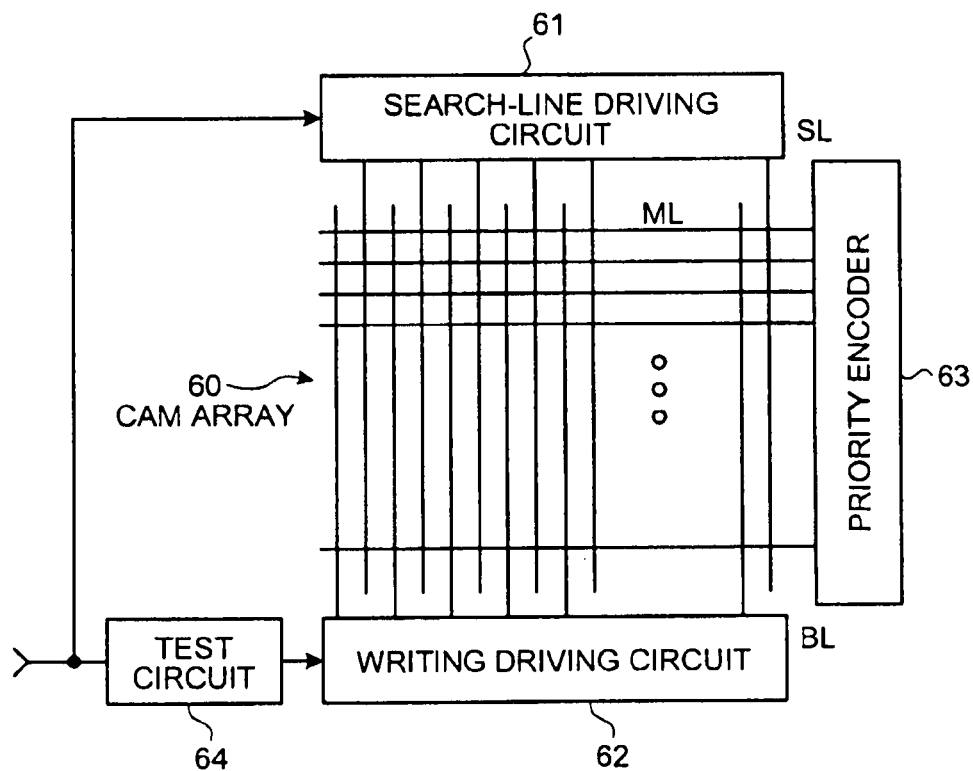
FIG. 11 is a diagram for explaining a constitution that gives an acceleration condition for a failure included in a CAM device according to a fifth embodiment of the present invention.

FIG. 11 is a diagram for explaining a constitution for giving an acceleration condition for a failure included in a CAM device according to a fifth embodiment of the present invention. As shown in FIG. 11, in the CAM, a search-line driving circuit 61 that drives the search lines SL and performs a search operation and a writing driving circuit 62 that drives the bit lines BL to perform writing in cells are arranged to be opposed to each other around a CAM array 60. A priority encoder 63 that captures a state of the match lines ML is also arranged around the CAM array 60. A search data sequence and a writing data sequence are input to the search-line driving circuit 61 and the writing driving circuit 62 from the outside. According to the fifth embodiment, a test circuit 64 is provided in an input line of the writing data sequence to the writing driving circuit 62. A readout circuit system is not shown in the figure.

Figure 13:
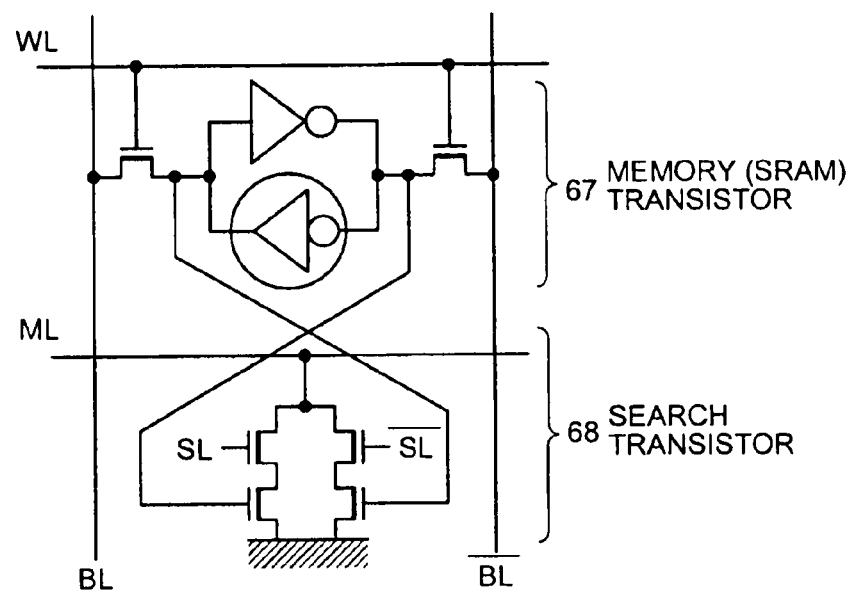
FIG. 13 is a diagram for explaining presence of a margin failure in a memory cell as an example of an operation marginal failure.
Figure 14:
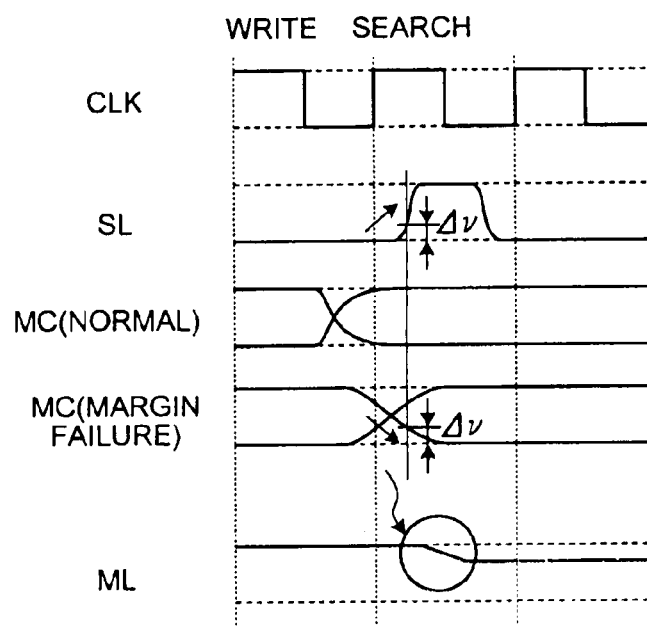
FIG. 14 is a diagram for explaining operations of the memory cell at the time when the margin failure is absent and the margin failure is present.
Figure 15:
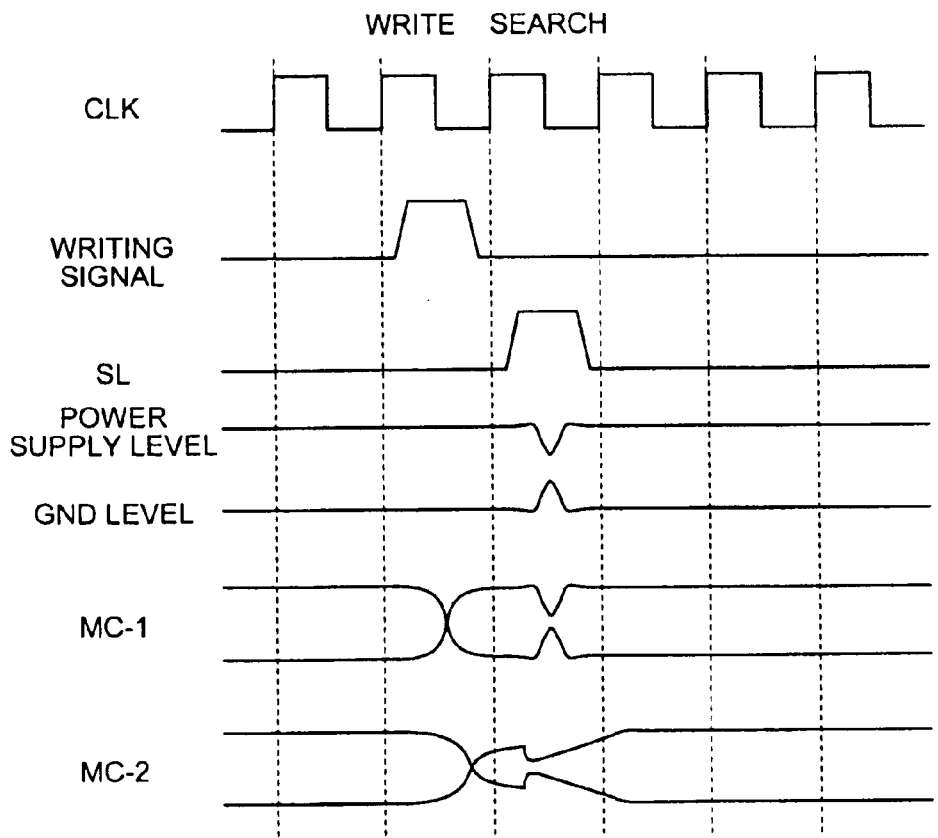
FIG. 15 is a diagram for explaining an influence of power supply noise exerted on an operation marginal failure.

FIG. 12 is a circuit diagram of a specific example of a constitution of the test circuit shown in FIG. 11. As shown in FIG. 12, the test circuit 64 is a delay time adjusting circuit that selects, for example, three kinds of delay times a, b, and c (a<b<c) using the selector 66 and gives the delay times to the writing data sequence to be input to the writing driving circuit 62. The test circuit 64 is provided assuming operation marginal failures shown in FIGS. 13 to 15. FIG. 13 is a diagram for explaining presence of a margin failure in a memory cell as an example of the operation marginal failure. FIG. 14 is a diagram for explaining operations of the memory cell at the time when the margin failure is absent and the margin failure is present. FIG. 15 is a diagram for explaining an influence of power supply noise exerted on the operation marginal failure.

As shown in FIG. 13, each memory cell (MC) in the CAM array 60 includes a memory (SRAM) transistor 67 and a search transistor 68. The memory (SRAM) transistor 67 is connected to the word line WL and the bit lines BL and /BL. The search transistor 68 is connected to the match line ML and the search line SL.

In the SRAM and the DRAM, when readout from an identical memory cell is immediately performed in a state in which writing in the memory cell is not completed, the memory cell is connected to the bit lines BL and /BL in a state in which a node of the memory cell is not completely stabilized, that is, a state in which a cell node does not reach a power supply Vdd level and a GND level. Thus, a potential difference read out between the bit lines BL and /BL is smaller than a normal value. Therefore, it is difficult for a sense amplifier to perform amplification within a normal time. It is likely that a readout error occurs in the sense amplifier. In the worst case, it is also likely that data of a cell is reversed at an instance when the memory cell is connected to the bit lines BL and /BL.

In this way, in the SRAM and the DRAM, immediate execution of a readout instruction Read on the identical memory cell after execution of a writing instruction Write is effective means for testing whether the memory cell is manufactured and operating in a normally balanced state and whether it is likely that an operation marginal failure due to unbalance occurs. Thus, this is generally performed.

In the CAM, when a search instruction Search is immediately executed after execution of a writing instruction Write, the same phenomenon occurs as shown in FIG. 14. Thus, it is possible to use this as means for testing a margin failure in the same manner.

In FIG. 14, an operation at the time when the search instruction Search is executed at the next clock CLK of a clock CLK at which the writing instruction Write is executed is shown. In the memory cell (MC) shown in FIG. 13, when there is no margin failure and the memory cell is normal, as indicated by MC (normal) in FIG. 14, writing is completed within a period of a clock CLK at which writing is performed. Thus, even if search is performed at the next clock CLK, since a cell node correctly reaches a ground potential (GND) level, the search transistor 68 does not malfunction.

However, in FIG. 13, when a transistor encircled in the memory (SRAM) transistor 67 becomes unbalance due to some reason, for example, a defect in manufacturing, as indicated by MC (margin failure) in FIG. 14, time required for completion of writing becomes longer than that at the normal time and runs over into the next clock CLK. Therefore, when a search instruction is executed at the next clock CLK of the clock CLK at which writing is performed, the search line SL is driven immediately after the cell node is reversed or in a process in which the cell not is reversed. Thus, the cell node does not correctly reach the ground potential (GND). The search transistor 68 is turned on by mistake and the match line ML is discharged by mistake (indicated by a circle in ML in FIG. 149. This means that an operation marginal failure occurs.

Since the CAM consumes extremely large electric power during operation, power supply noise larger than that of other memories occurs. The power supply noise significantly relates to the margin failure described above (see FIG. 15). In FIG. 15, a writing signal, a searching signal on the search line SL, nose that occurs at a power supply level and a ground potential (GND) level at the time of search, and operation waveforms in two memory cells (MC−1 and MC−2) at the time when the search instruction Search is executed at the next clock CLK of the clock CLK at which the writing instruction Write is executed are shown.

As shown in FIG. 15, if noise occurs in the power supply level and the ground potential (GND) level and the power supply level falls, time until the cell node completes writing becomes longer or time for simply returning unbalance caused by the noise to a normal state becomes longer. This causes acceleration of this operation marginal failure.

An operation margin giving an index of such an operation marginal failure significantly depends on cell unbalance due to differences of impedance and inductance of a package and a board other than a power supply inside the CAMLSI. When the CAMLSI is judges as non-defective under an environment of a shipment test for the CAMLSI but is judges as defective in a power supply state of a system board of a user, this often seems to be an operation marginal failure due to differences of conditions around the power supply.

Figure 16:
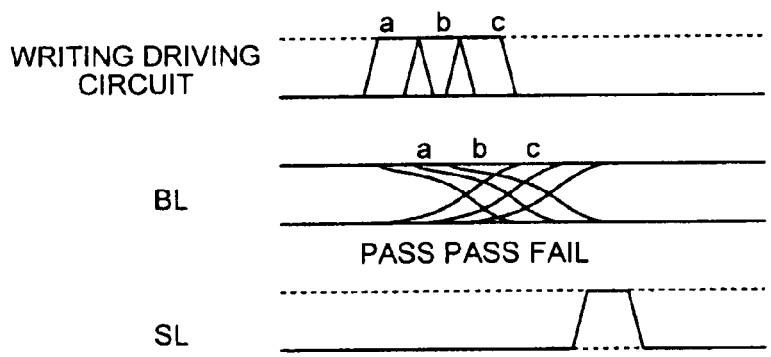
FIG. 16 is a diagram for explaining an operation of a constitution that gives an acceleration condition for a failure shown in FIG. 11.

Thus, according to the fifth embodiment, as shown in FIGS. 11 and 12, it is possible to adjust, with the test circuit 64 that performs delay time adjustment, time from writing in the memory cell until the search line SL is activated for every delay time of a, b, and c (a<b<c) as shown in FIG. 16.

FIG. 16 is a diagram for explaining an operation of a constitution that gives an acceleration condition for a failure shown in FIG. 11. In FIG. 16, a relation among an operation state of the writing driving circuit 62 for every detail time of a, b, and c, pass/fail on the bit line BL, and activation of the search line SL is shown. As shown in FIG. 16, it is possible to accelerate and test a memory cell having a factor of an operation marginal failure by adjusting to extending time from writing in the memory cell until the search line SL is activated to the delay times a, b, and c.

Therefore, for example, in a shipment test for the CAMLSI, when the CAMLSI is pass under the same condition of the delay time "a" as the normal mode, in a state in which the CAMLSI is mounted on the system board of the user, it is assumed that power supply noise further requiring time for writing occurs as in the delay time "b" and the delay time "c". In other words, occurrence of an operation marginal failure on the user side is anticipated. Under such assumption or anticipation, it is possible to adjust a delay time to a state accelerated to the delay time "b" or the delay time "c" rather than the delay time "a" to ship the CAMLSI. Thus, it is possible to realize improvement of reliability and a quality.

In addition, according to the fifth embodiment, as explained with reference to FIG. 14. it is possible to specify an address of a memory cell, in which an operation marginal failure is likely to occur, by performing tests for writing and search at the next clock of a clock at which writing is performed. Thus, it is possible to set the address in advance in a redundant circuit (a hardware repair area) that can take remedial measures with a method such as fuse blow and ship the CAM.

Figure 17:
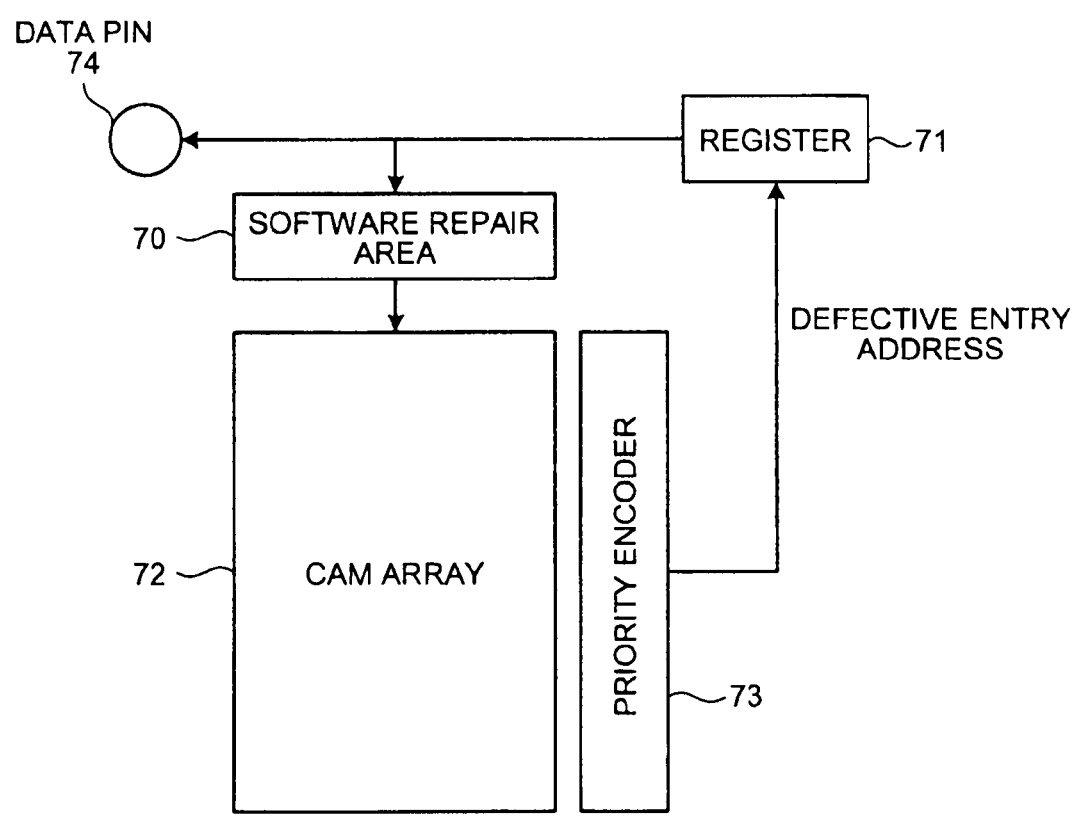
FIG. 17 is a diagram for explaining a constitution that makes it possible to perform software repair on a user side included in a CAM device according to a sixth embodiment of the present invention.

FIG. 17 is a diagram for explaining a constitution that makes it possible to perform software repair on a user side included in a CAM device according to a sixth embodiment of the present invention. In FIG. 17, in the CAM device, a software repair area (a redundant circuit that can take remedial measures in terms of software) 70 and a register 71 are added. It is possible to access the software repair area 70 and the register 71 from a data pin 74.

In a CAM array 72, as explained according to the fifth embodiment, a detection test for a memory cell, in which an operation marginal failure is likely to occur, is performed and remedial measures are taken in an accelerated state (in the examples in FIGS. 12 and 16, the delay time "b" or the delay time "c") assuming power supply noise that occurs under a power supply environment on the user side. However, according to the sixth embodiment, the defective entry address is set in the register 71 from the priority encoder 73 and the CMA device is shipped in this state.

Usually, on the user side, an acceptance test is carried out for the purpose of rejecting a failure part in a distribution process before mounting the part and verifying whether a shipment test is appropriately performed on an LSI product vender side. For the CAMLSI shipped after applying the test anticipating an operation marginal failure due to unbalance of a memory cell explained according to the fifth embodiment, remedial measures are taken in an accelerated state assuming power supply noise that occurs under the power supply environment on the user side. Thus, basically, it is less likely that the same failure occurs in the acceptance test on the user side. However, depending on a state of the system board on the user side, a driving method for the CAM, or the like, it is not entirely unlikely that a failure that cannot be expected on the vender side occurs.

The CAM according to the fifth embodiment is shipped after taking remedial measures in a state accelerated to the delay time "b" or the delay time "c" in the examples in FIGS. 12 and 16. Thus, even if the user side tests the CAM in a state of the delay time "a", basically, it should be unlikely that an operation marginal failure occurs. However, as described above, depending on an actual power supply state on the user side, it cannot be said that it is entirely unlikely that an operation marginal failure occurs.

Thus, according to the sixth embodiment, a normal state of the respective memory cells (the delay time "a" in the examples in FIGS. 12 and 16) is released to the user side as a built-in selftest (BIST). Therefore, when a failure should occur in an acceptance test on the user side, it is possible to recognize a defective entry address stored in the register 71 from the system through the data pin 74 on the user side and take remedial measures using the software repair area 70.

However, the software repair area 70 is not always necessary. When the number of defective entry addresses stored in the register 71 is small, the software repair area 70 is unnecessary. In other words, when the number of the defective entry addresses stored in the register 71 is, for example, one or very small, as a system, the user side can easily use the CAMLSI while avoiding only the address.

Consequently, on the user side, it is possible to keep a quality of the entire system regardless of a failure of the CAMLSI. On the vender side, it is possible to expect improvement of a quality of the CAMLSI.

Figure 18:
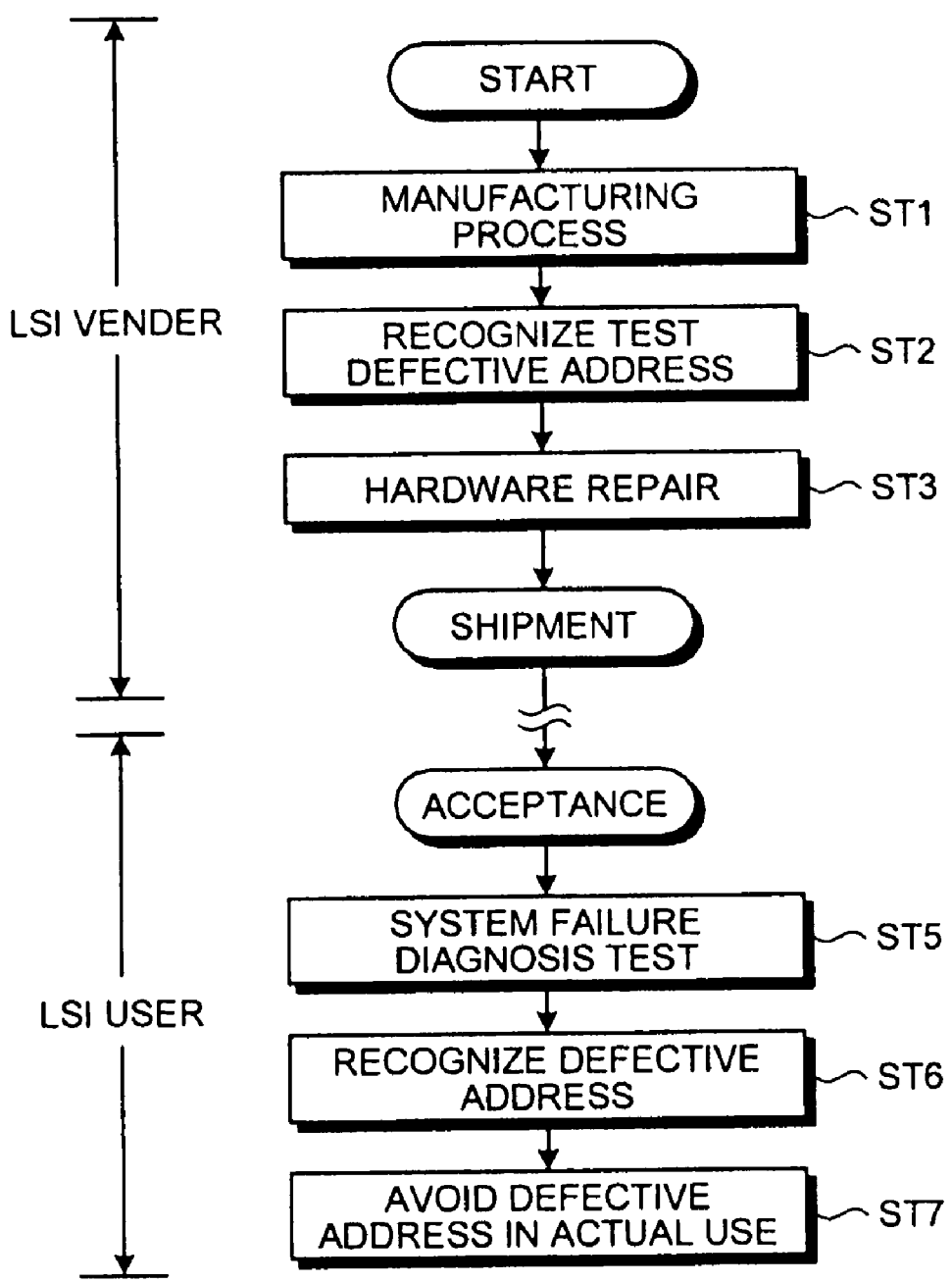
FIG. 18 is a flowchart for explaining improvement (1) of a quality by cooperative work on a vender side and a user side of a CAMLSI as a seventh embodiment of the present invention.
Figure 19:
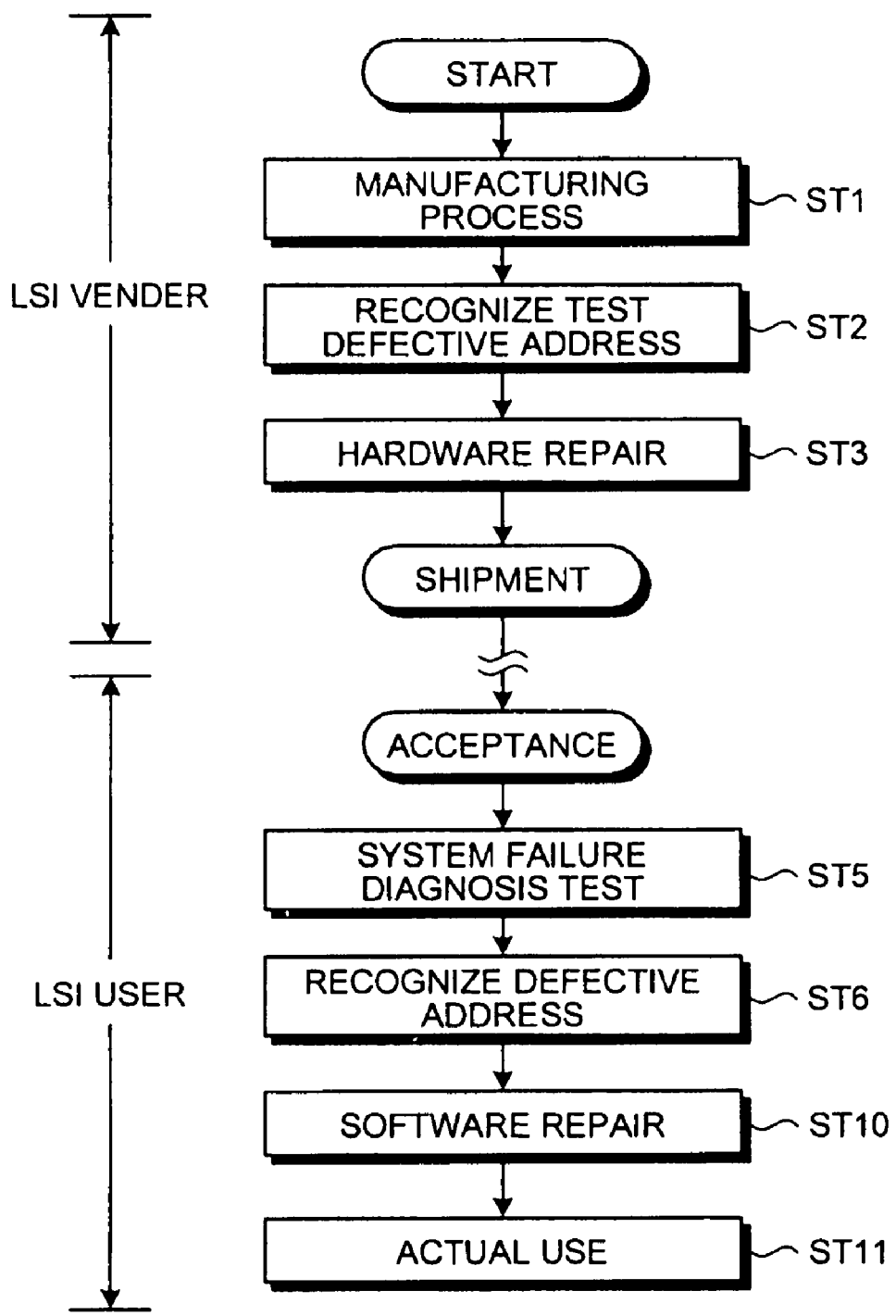
FIG. 19 is a flowchart for explaining improvement (2) of a quality by cooperative work on the vender side and the user side of the CAMLSI as the seventh embodiment.

In a seventh embodiment of the present invention, improvement of a quality is realized by combination of hardware repair measures on a vender side and software repair measures on a user side of a CAMLSI. FIGS. 18 and 19 are flowcharts for explaining improvement of a quality by cooperative work of the vender side and the user side of the CAMLSI.

In FIG. 18, remedial procedures at the time when a CAM device is mounted with only a hardware repair mechanism are described. In FIG. 18, in a manufacturing process (ST1), the LSI vender side carries out a test for detecting an operation functional failure to recognize a defective address (ST2). The LSI vender side takes hardware repair measures generally adopted such as fuse blow (ST3) and ships the CAM device. In an acceptance process, the LSI user side carries out a system diagnosis test for detecting an operation marginal failure (ST5) and recognizes a defective address (ST6). In actual use, as a system, the LSI user side takes measures for excluding the defective address from an object of use.

In FIG. 19, remedial procedures at the time when the CAM device is mounted with only a hardware repair mechanism and includes a software repair area usable on the user side are described. In FIG. 19, the LSI vender side operates in the same manner as FIG. 18. The LSI user side carries out a system diagnosis test for detecting an operation marginal failure in an acceptance process (ST5) and recognizes a defective address (ST6). The LSI user side takes remedial measures for the defective address using the software repair area on the CAMLSI (ST10) and shifts to actual use in a state without an unused address (ST11).

As described above, an operation marginal failure occurs in some cases and does not occur in other cases depending on a system board and an operation environment on the user side. Thus, it can be said that software repair measures on the user side are effective. Consequently, on the user side, it is possible to realize quality management for the system. On the vender side, it is possible to realize improvement of reliability and a quality.

Figure 20:
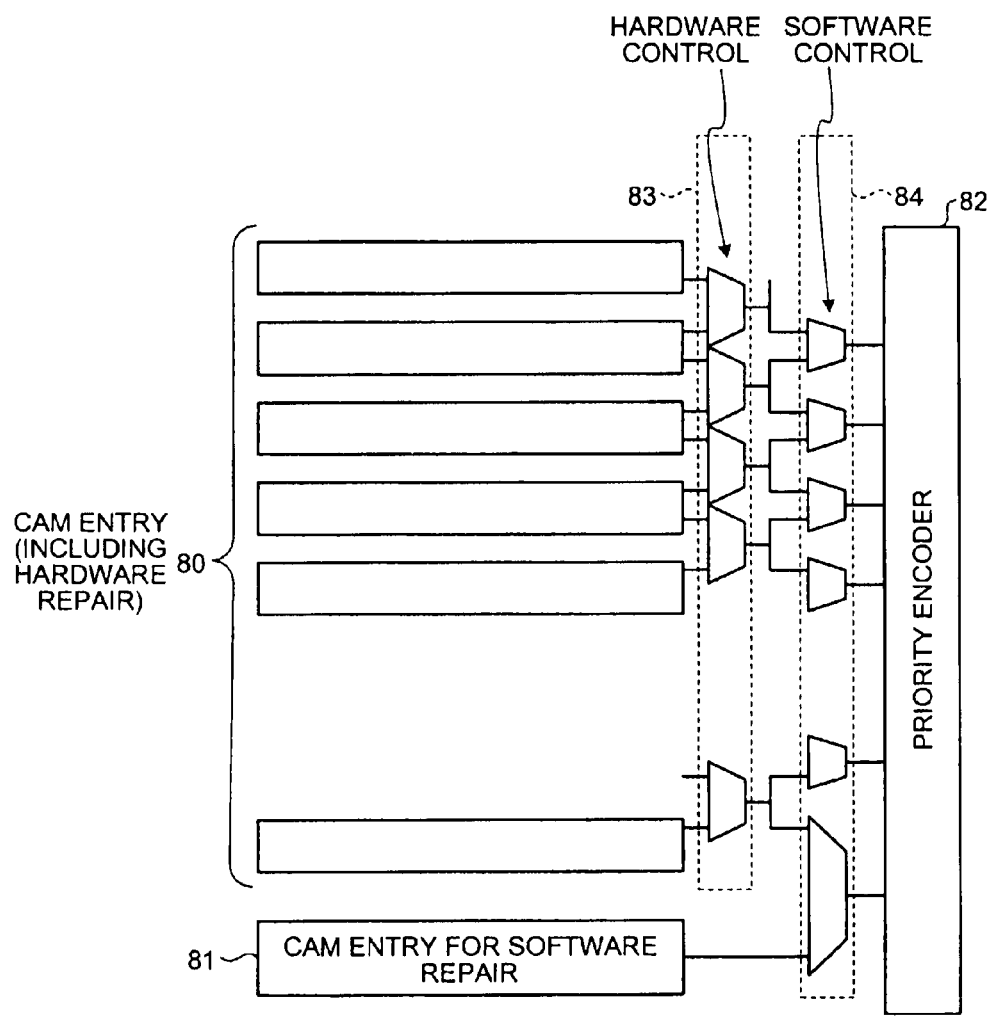
FIG. 20 is a diagram for explaining a CAM device (1) mounted with both a hardware repair mechanism and a software repair mechanism according to an eighth embodiment of the present invention.

FIG. 20 is a diagram for explaining a CAM device (1) mounted with both a hardware repair mechanism and a software repair mechanism according to an eighth embodiment of the present invention. In FIG. 20, in a CAM array, a software repair CAM entry 81 is prepared other than CAM entries 80 including hardware repair. A selector 83 operated according to hardware control and a selector 84 operated according to software control are provided between the CAM entries 80 and a priority encoder 82.

The selector 83 selects an output for which hardware replacement and repair are carried out in the method explained above in the CAM entries 80. The selector 84 selects an output of the selector 83 and gives the output to the priority encoder 82. Alternatively, the selector 84 uses the software repair CAM entry 81 to select an output for which repair measures are carried out and give the output to the priority encoder 82.

Figure 21:
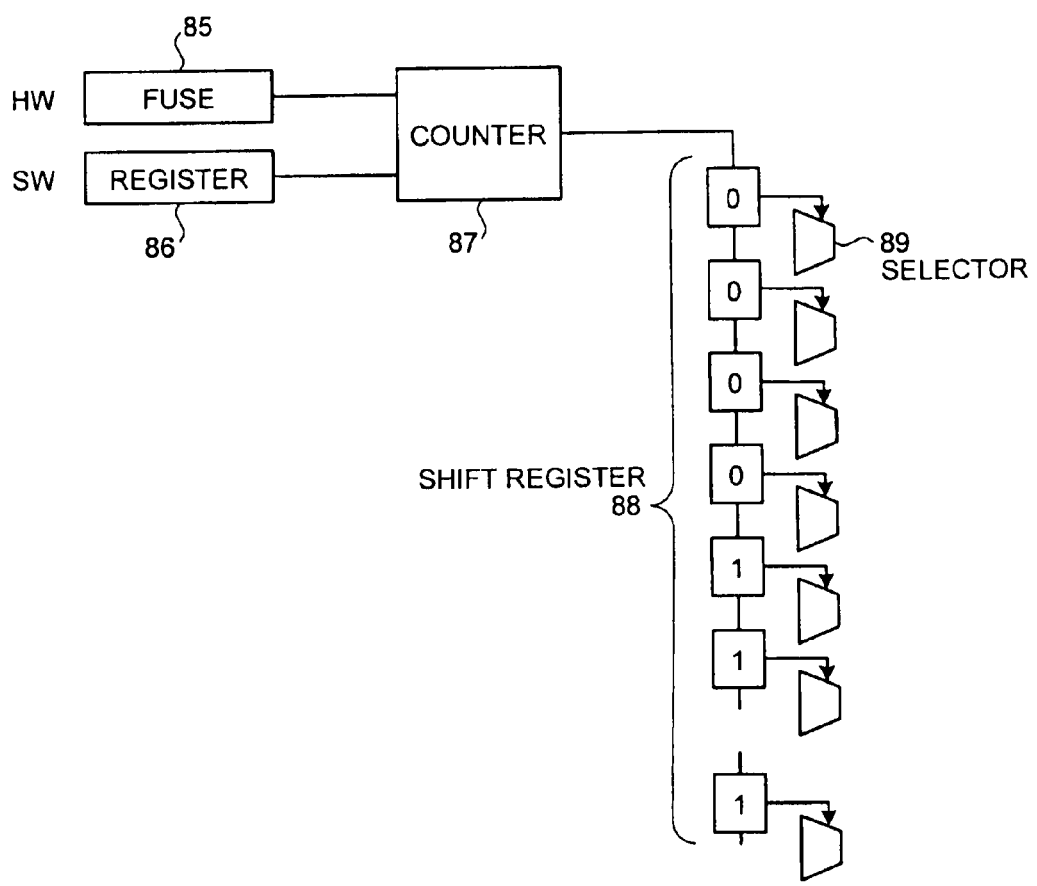
FIG. 21 is a diagram for explaining a difference between hardware control (hardware repair) and software control (software repair) shown in FIG. 20.
Figure 22:
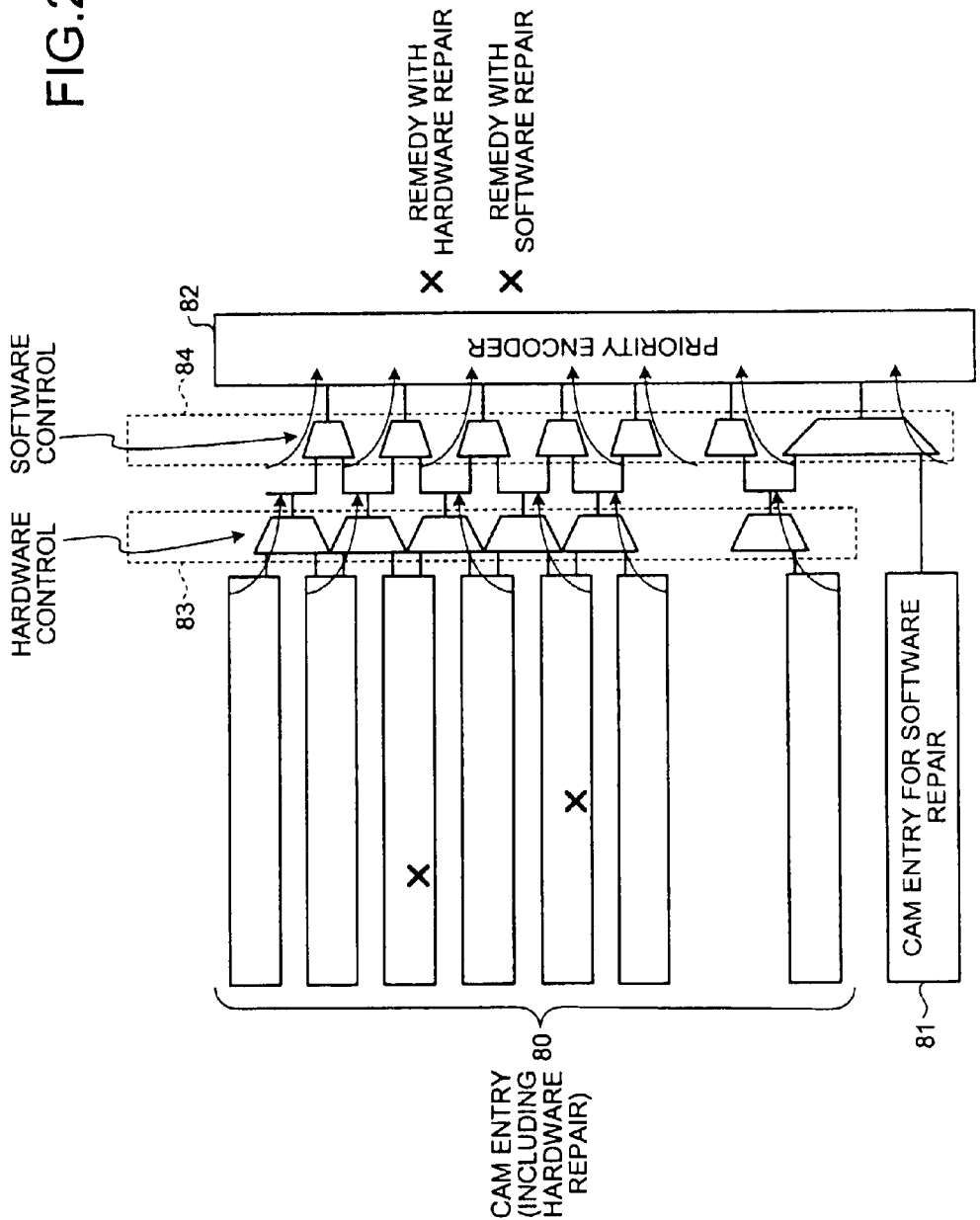
FIG. 22 is a diagram for explaining an example of remedy by the hardware control (hardware repair) and the software control (software repair) shown in FIG. 20.

FIG. 21 is a diagram for explaining a difference between the hardware control (hardware repair) and the software control (software repair) shown in FIG. 20. FIG. 22 is a diagram for explaining an example of remedy by the hardware control (hardware repair) and the software control (software repair) shown in FIG. 20.

As shown in FIG. 21, in hardware repair measures (HW), a fuse 85 is blown. In software repair measures (SW), a defective entry address is stored in a register 86 (see FIG. 17). This is a difference between the hardware repair measures and the software repair measures. In general, the number of measures is counted by a counter 87, a shift register 88 is operated to shift, and a selector 89 is controlled by outputs of respective shift stages.

With such a constitution, as shown in FIG. 22, in the CAMLSI, it is possible to remedy an operation functional failure with the hardware repair measures and remedy an operation marginal failure with the software repair measures.

Figure 23:
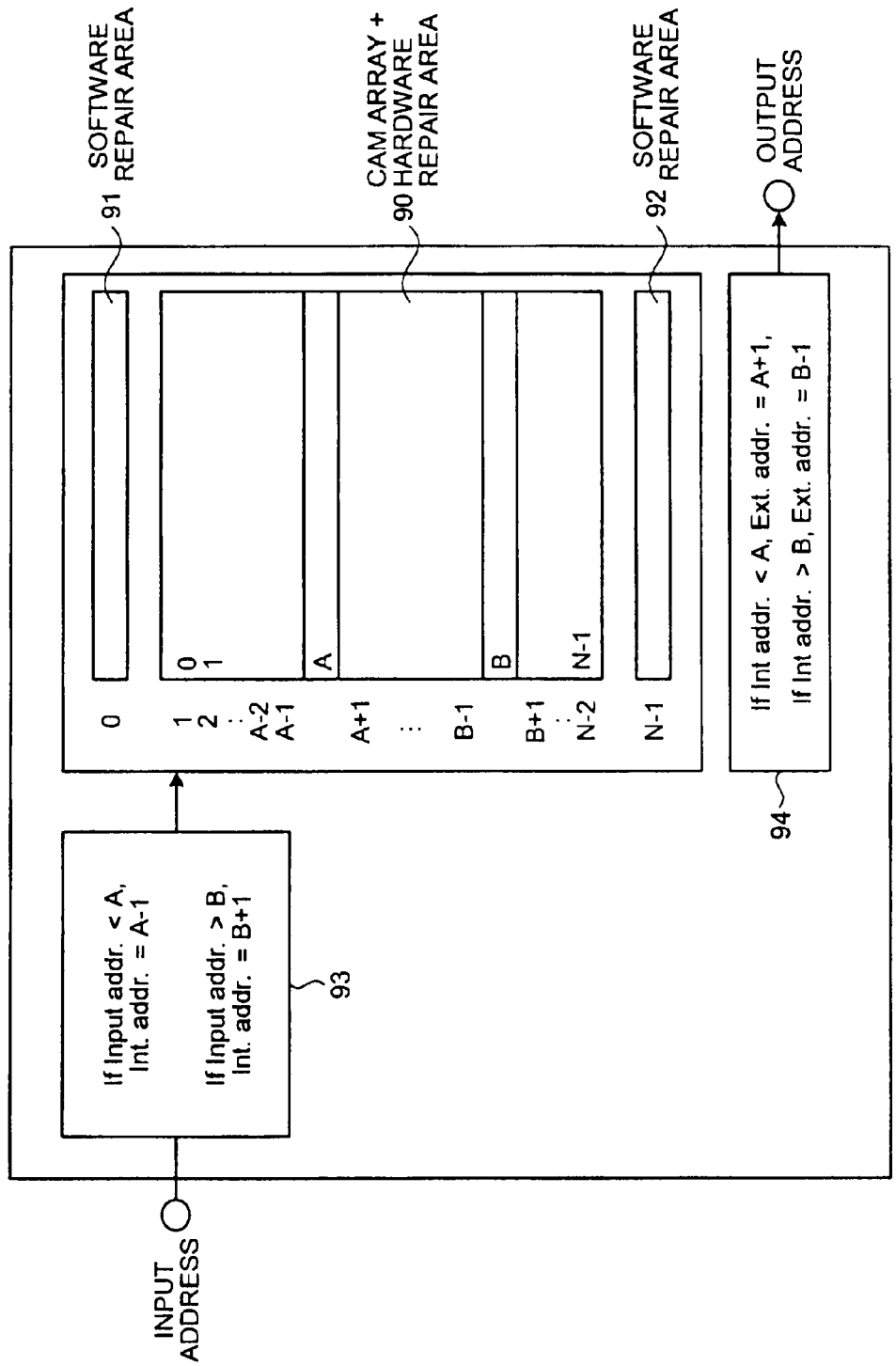
FIG. 23 is a diagram for explaining a CAM device (2) mounted with both a hardware repair mechanism and a software repair mechanism according to a ninth embodiment of the present invention.
Figure 24:
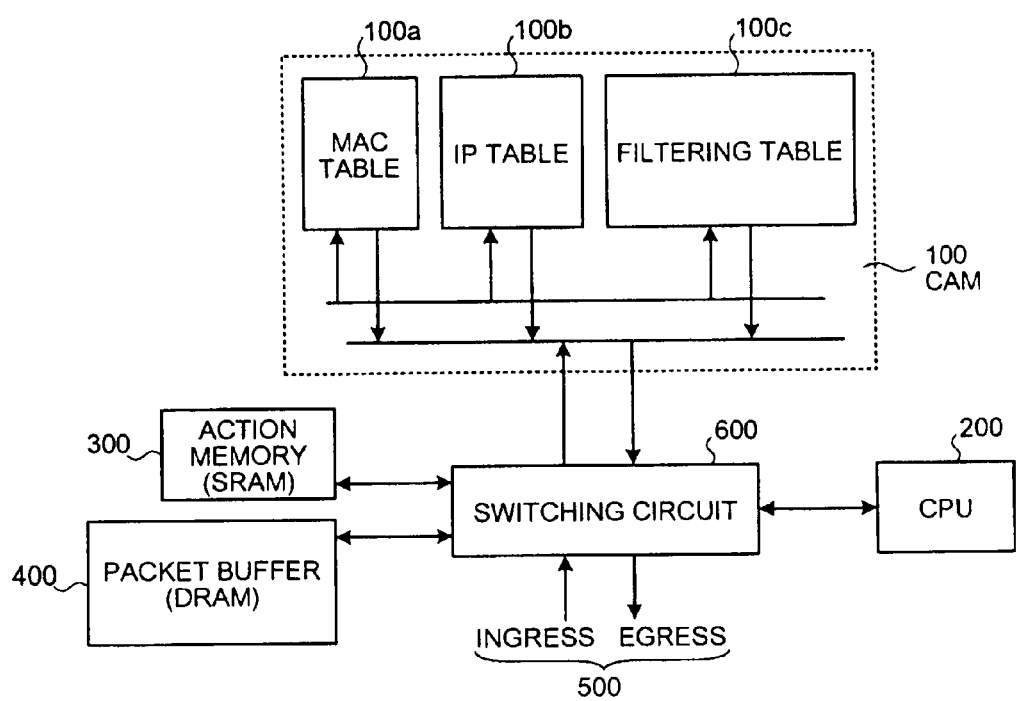
FIG. 24 is a block diagram of an example of a constitution of a network apparatus.
Figure 25:
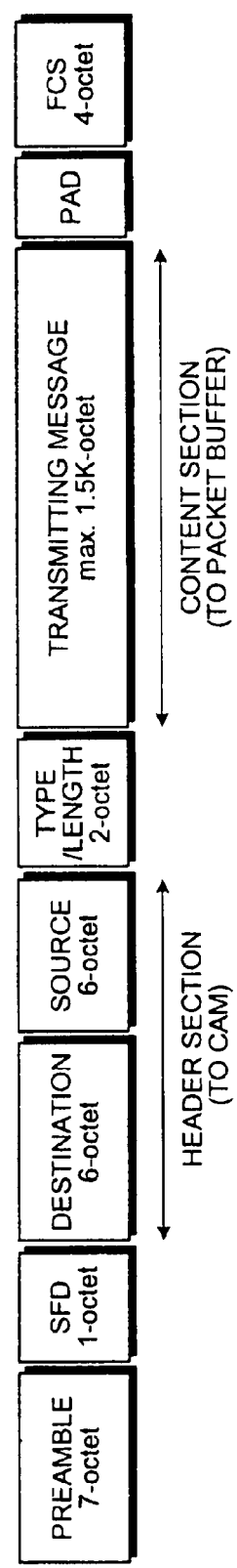
FIG. 25 is a diagram of a packet constitution in an Ethernet (registered trademark frame.
Figure 26:
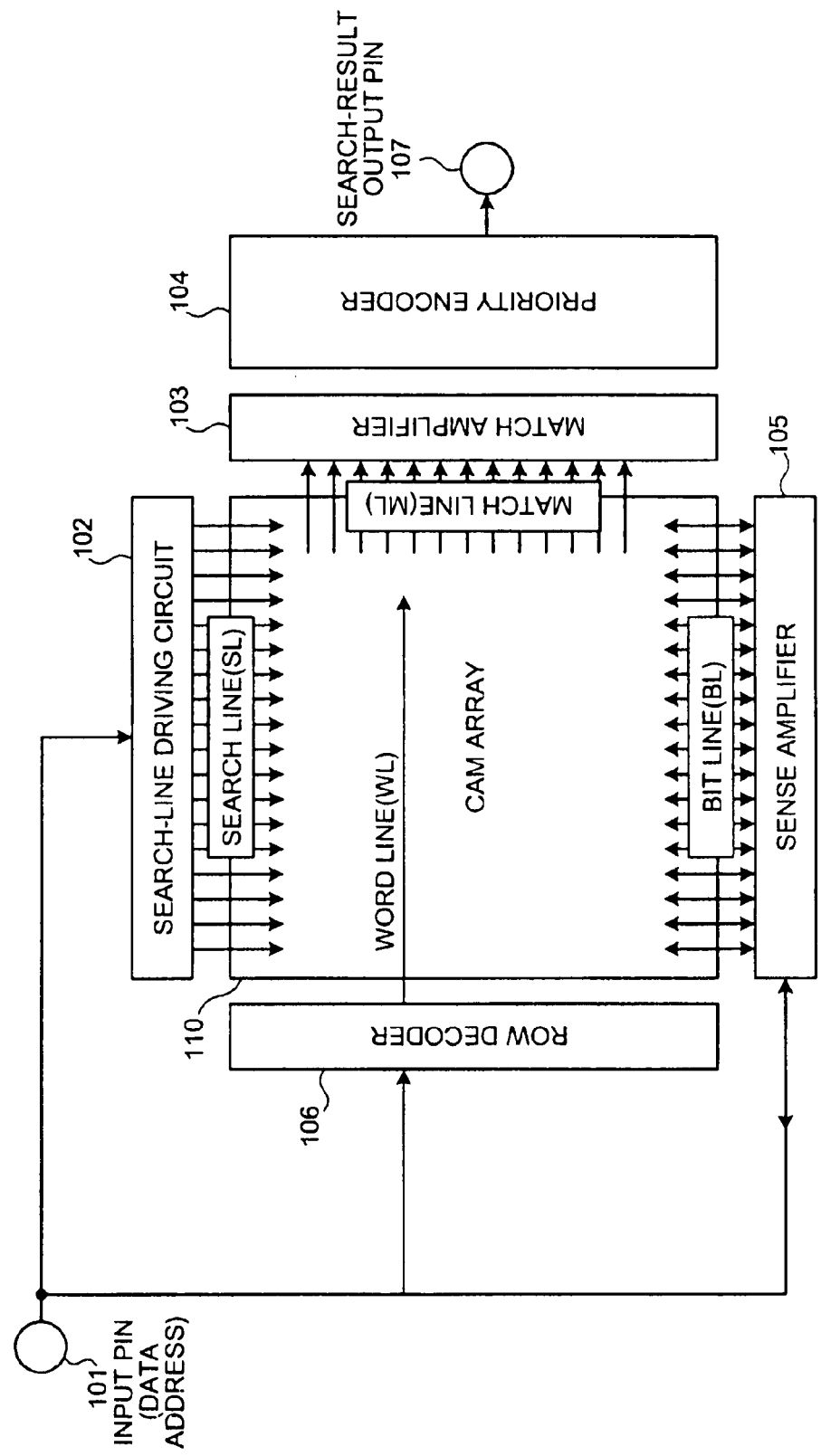
FIG. 26 is a block diagram of a main part constitution of a CAM shown in FIG. 25.
Figure 27:
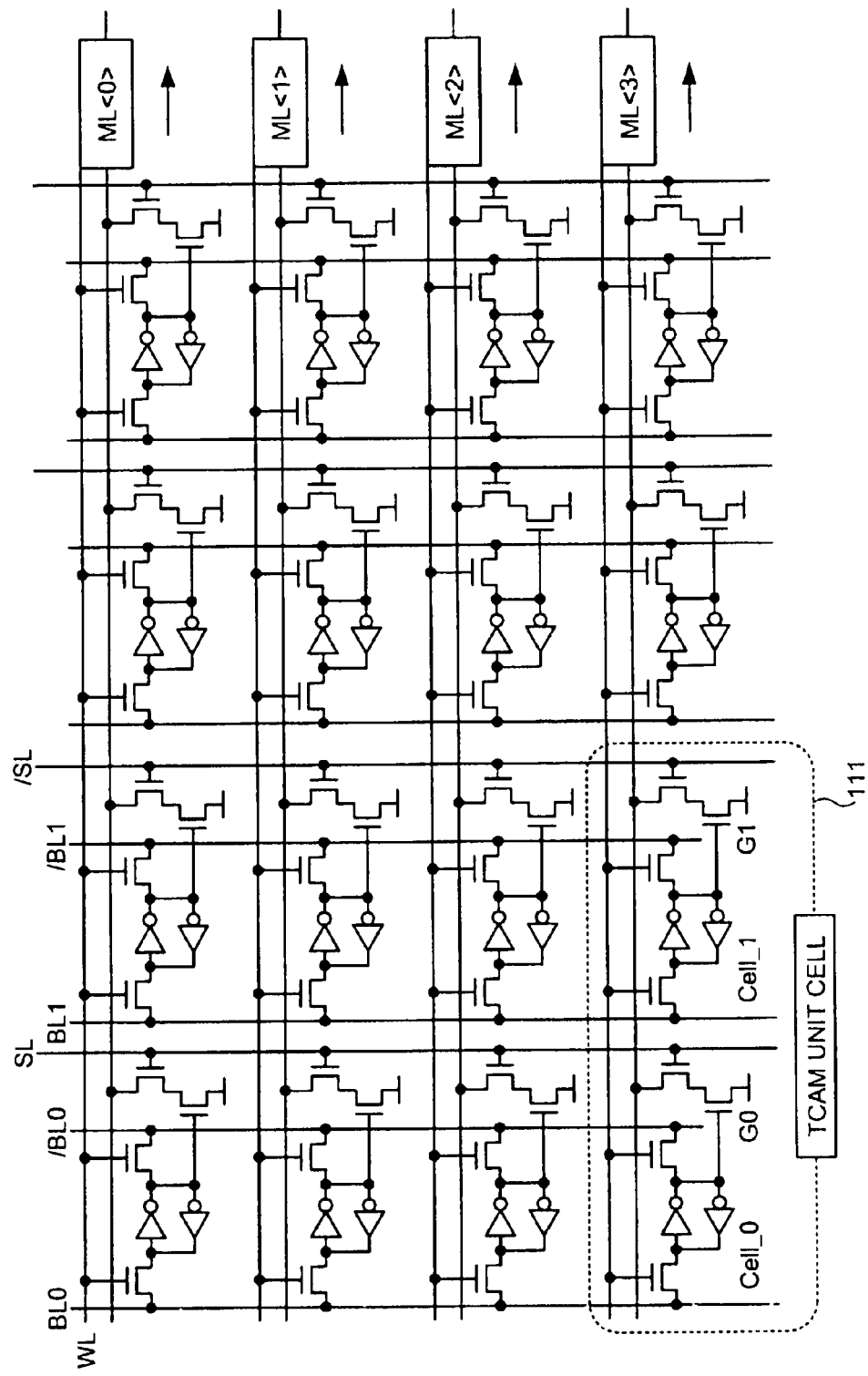
FIG. 27 is a circuit diagram of a constitution of a CAM array shown in FIG. 26.
Figure 29:
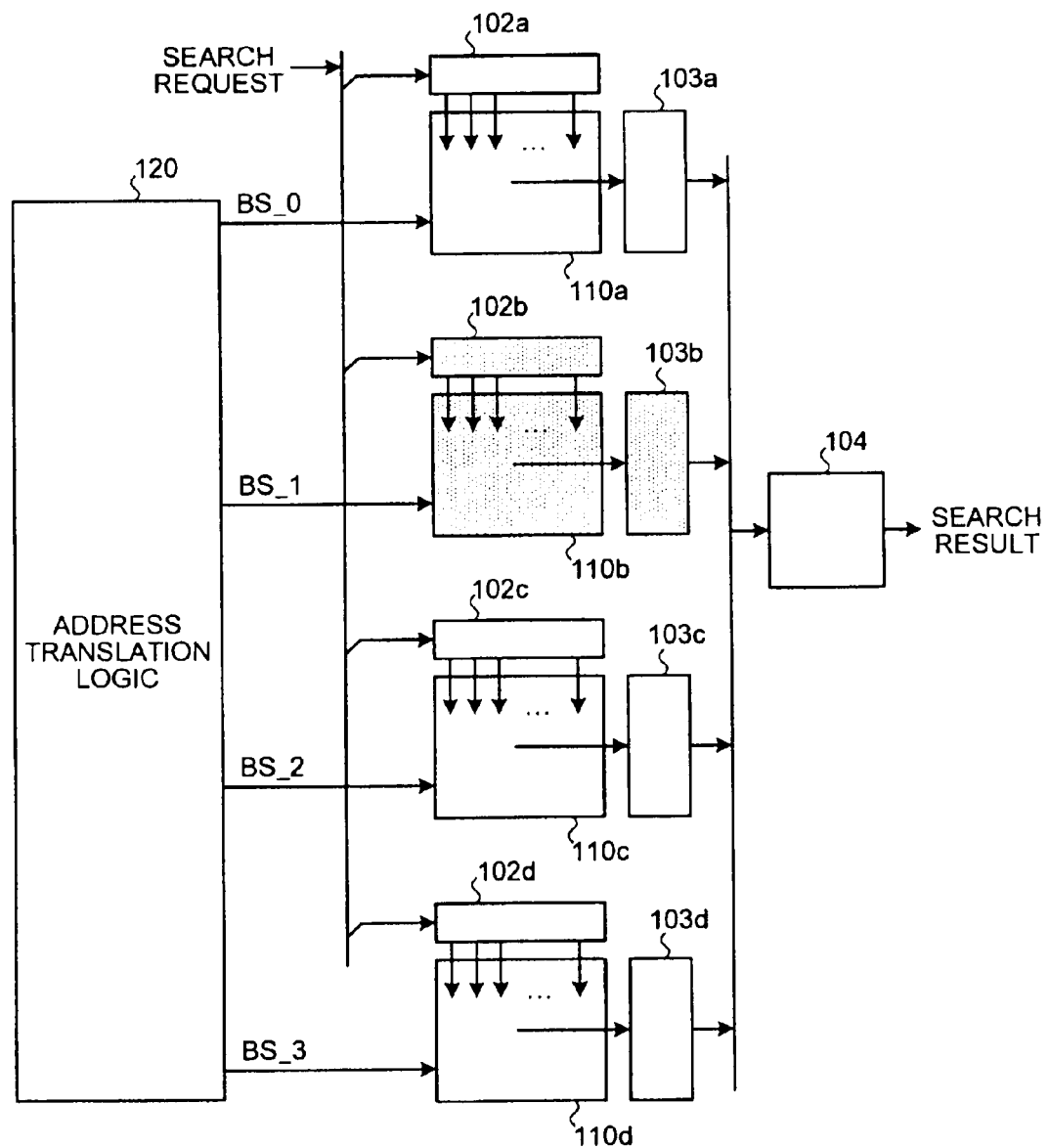
FIG. 29 is a block diagram of a conventional example (1) that realizes low power consumption of a large capacity CAM.
Figure 30:
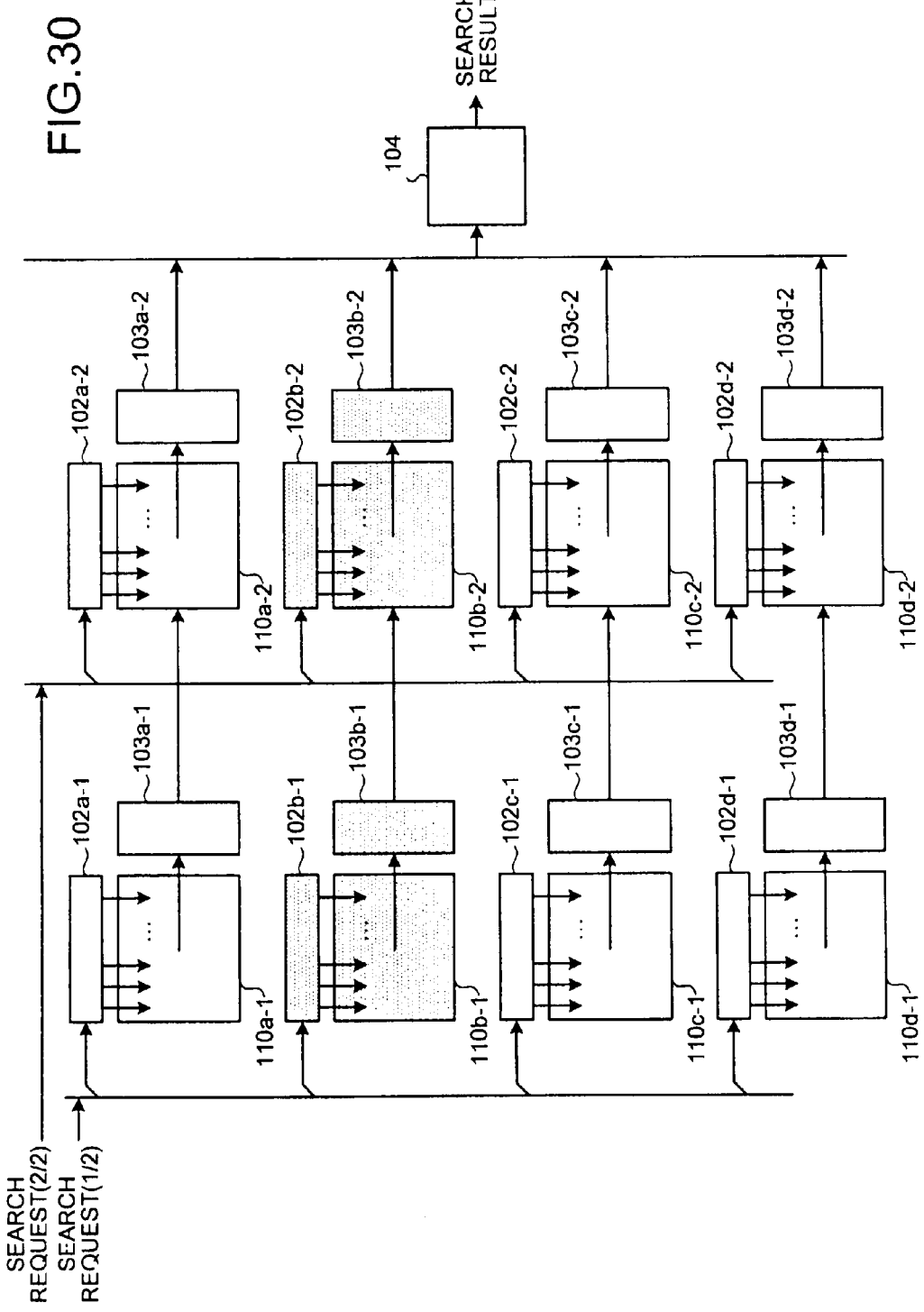
FIG. 30 is a block diagram of a conventional example (2) that realizes low power consumption of a large capacity CAM.
Figure 31:
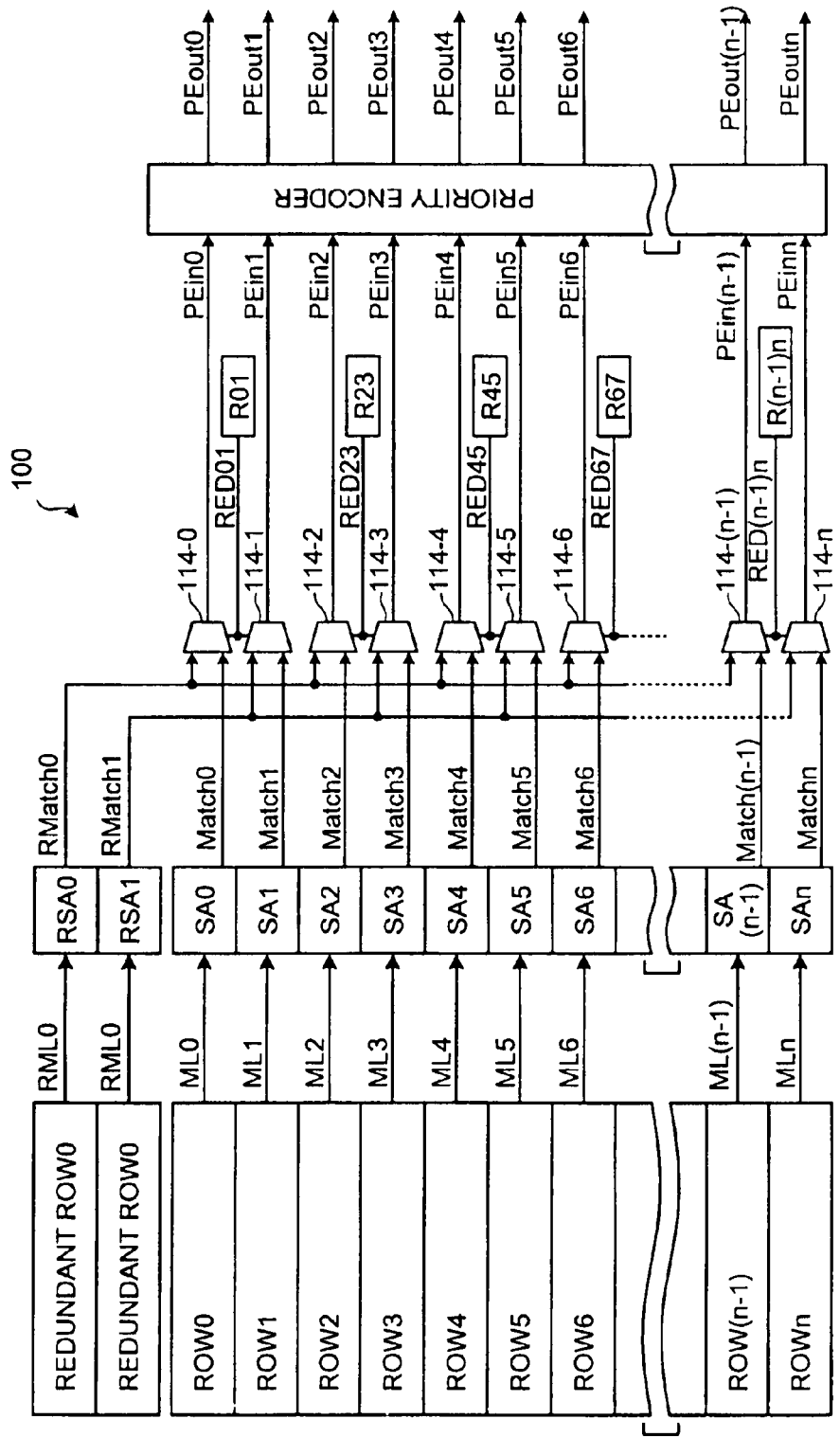
FIG. 31 is a block diagram of a conventional example that improves a manufacturing yield of a CAM.
Figure 32:
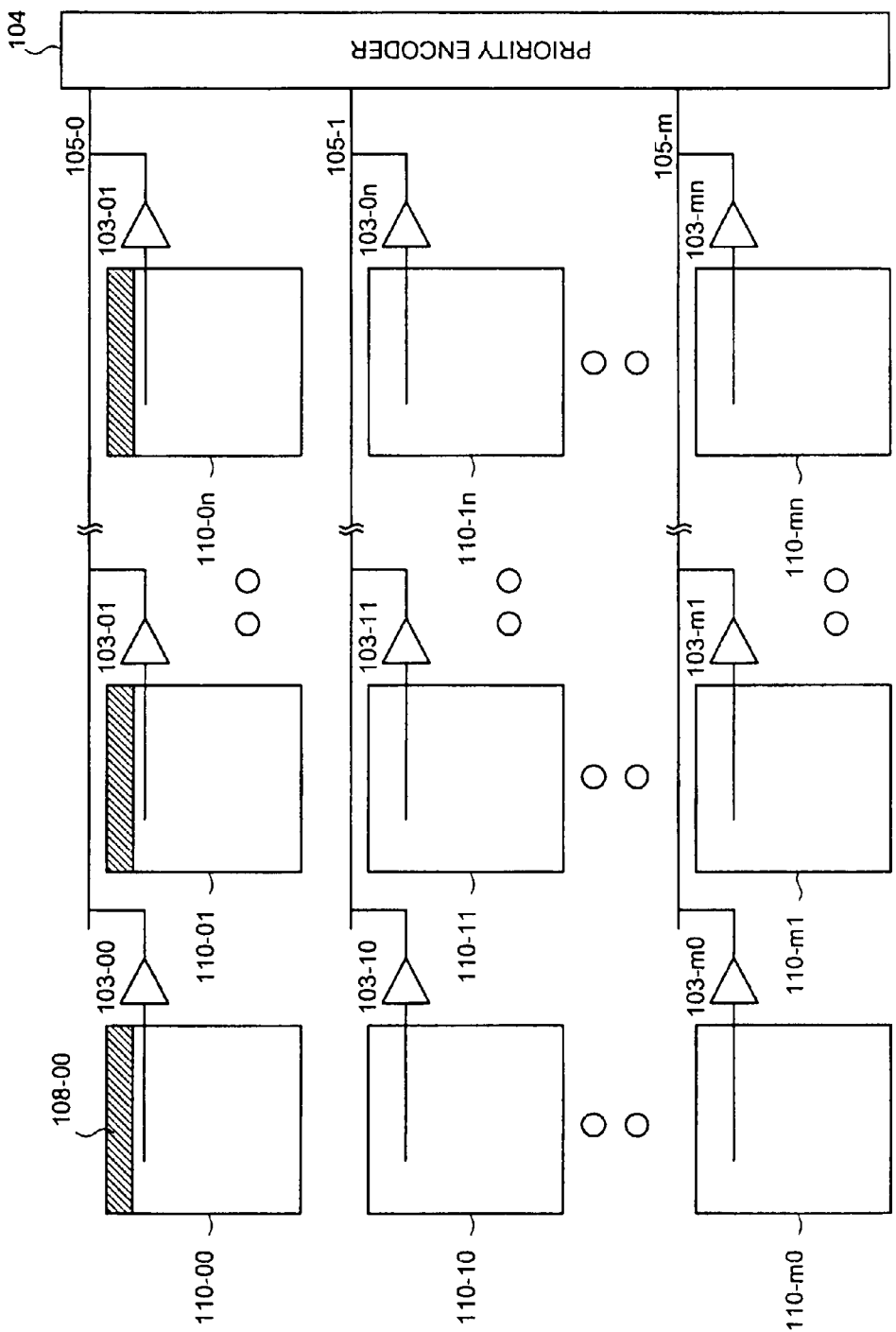
FIG. 32 is a block diagram of an example of an increase in memory cell occupancy in the CAM.

FIG. 23 is a diagram for explaining a CAM device (2) mounted with both a hardware repair mechanism and a software repair mechanism according to a ninth embodiment of the present invention. In FIG. 23, a CAM array and a hardware repair area 90 are formed by N addresses from an address 0 to an address N−1. One software repair area 91 and one software repair area 92 are formed on an LSB side and an MSB side on the outside of the CAM array and the hardware repair area 90, respectively. A comparator 93 is provided on an input address side. A comparator 94 is provided on an output address side.

When defects occur in an entry address A and an entry address B in the CAM array 90 as a result of a test by the method explained above, the entry address A and the entry address B are programmed in the comparator 93 on the input address side and the comparator 94 on the output address side, respectively.

In an operation of writing or readout, first, the comparator 93 on the input address side compares a size relation between an input address and the entry addresses A and B. As a result of the comparison, if the input address (Input addr.)<the entry address A, the entry address A is converted into an internal address (Int.addr) A−1. If the input address (Input addr.)>the entry address B, the entry address B is converted into an internal address (Int.addr) B+1. Writing and readout are carried out using the internal addresses (Int.addr) converted in this way.

At the time of a search operation, conversely, in the comparator 94 on the output address side, if the internal address (Int.addr)<the entry address A, the entry address A is converted into an external address (Ext.addr) A+1 and output. If the internal address (Int.addr)>the entry address B, the entry address B is converted into an external address (Ext.addr) B−1 and output.

In this way, according to the ninth embodiment, it is possible to remedy, in terms of software, a defect that occurs in an array according to conversion of an internal address by a size comparison in the comparators provided in the CAMLSI. Hardware repair measures are carried out in the same method as the eighth embodiment.

According to the present invention, there is an effect that it is possible to obtain a CAM device that can realize low power consumption by adding a small number of hardware components and in which division of sub-arrays that can follow a degree of freedom required by an application is possible.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A content-addressable-memory device comprising:
a plurality of content-addressable-memory sub-arrays having comparators that simultaneously perform a parallel comparison between a plurality of data sequences arranged in a row direction of memory cells and a search data sequence input from outside, wherein the comparators output a result of the comparison for each of the data sequences; and
a plurality of priority encoders, each priority encoder arranged to correspond with one of the content-addressable-memory sub-arrays, wherein
each of the priority encoders includes
a plurality of priority determining circuits arranged to be divided, for each fixed address length, in a corresponding content-addressable-memory sub-array, and configured to determine a priority based on a result of the comparison for each of the data sequences for the address length;
a plurality of lower-order address encoders, each lower-order address encoder arranged to correspond with one of the priority determining circuits to encode a lower-order address for which the priority is determined; and
a sending circuit, arranged between the priority determining circuits and the lower-order address encoders, to store defect information, and to send to the lower-order address encoders an output of each of the priority determining circuits other than an output related to a path matching stored information.

2. The content-addressable-memory device according to claim 1, wherein the sending circuit further includes:
a plurality of selectors, each of which receives the outputs from the corresponding priority determining circuits and sends one of the outputs related to the defect information;
and a plurality of resistors to store the defect information, each of the resistors arranged to correspond with one of the selectors.

* * * * *